United States Patent
Blanchard

(10) Patent No.: US 7,199,427 B2
(45) Date of Patent: *Apr. 3, 2007

(54) DMOS DEVICE WITH A PROGRAMMABLE THRESHOLD VOLTAGE

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/104,088

(22) Filed: Apr. 12, 2005

(65) Prior Publication Data

US 2005/0189586 A1 Sep. 1, 2005

Related U.S. Application Data

(62) Division of application No. 10/217,893, filed on Aug. 13, 2002, now Pat. No. 6,882,573.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/335; 257/315
(58) Field of Classification Search ............... 257/315, 257/335
See application file for complete search history.

(56) References Cited

U.S. PATENT DOCUMENTS

| | | | |
|---|---|---|---|
| 5,523,964 A | 6/1996 | McMillan et al. | 365/145 |
| 5,579,274 A | 11/1996 | Van Buskirk et al. | 365/185.33 |
| 5,689,459 A | 11/1997 | Chang et al. | 365/185.28 |
| 5,705,415 A * | 1/1998 | Orlowski et al. | 438/259 |
| 5,780,341 A * | 7/1998 | Ogura | 438/259 |
| 5,910,915 A | 6/1999 | Guterman et al. | 365/185.28 |
| 5,910,925 A | 6/1999 | Guterman et al. | 365/230.01 |
| 5,963,480 A | 10/1999 | Harari | 365/185.29 |
| 6,051,860 A * | 4/2000 | Odanaka et al. | 257/316 |
| 6,136,652 A | 10/2000 | Hazani | 438/260 |
| 6,301,162 B1 | 10/2001 | Ahn et al. | 365/189.07 |
| 6,324,101 B1 | 11/2001 | Miyawaki | 365/185.28 |
| 6,476,442 B1 | 11/2002 | Williams et al. | 257/328 |
| 6,538,275 B2 * | 3/2003 | Sugiyama et al. | 257/314 |
| 6,734,495 B2 * | 5/2004 | Blanchard | 257/335 |

OTHER PUBLICATIONS

Locher, R., Fairchild Semiconductor, Introduction to Power MOSFETS and Their Applications. National Semiconductor Application Note, No. 558, Dec. 1988.
Ochi, S., IXYS Corporation, Santa Clara, CA "Semiconductor Current Regulators Protect Circuits," *PCIM*, Jan. 2000, pp. 63-68.
Brown, William D. et al., Nonvolatile Semiconductor Memory Technology: A Comprehensive Guide to Understanding and Using NVSM Devices, IEEE Press, NY 1998, ppp. 9-19.

* cited by examiner

*Primary Examiner*—Howard Weiss
(74) *Attorney, Agent, or Firm*—Mayer & Williams PC; Karin L. Williams, Esq.; David B. Bonham, Esq.

(57) ABSTRACT

A DMOS device is provided which is equipped with a floating gate having a first and second electrode in close proximity thereto. The floating gate is separated from one of the first and second electrodes by a thin layer of dielectric material whose dimensions and composition permit charge carriers to tunnel through the dielectric layer either to or from the floating gate. This tunneling phenomenon can be used to create a threshold voltage that may be adjusted to provide a precise current by placing a voltage between a programming electrode and the body/source and gate electrode of the device.

15 Claims, 23 Drawing Sheets

U.S. Pat. No.

DMOS DEVICE WITH A PROGRAMMABLE THRESHOLD VOLTAGE

STATEMENT OF RELATED APPLICATIONS

This application is a divisional of U.S. patent application Ser. No. 10/217,893, filed Aug. 13, 2002, now U.S. Pat. No. 6,882,573, entitled "A DMOS Device With A Programmable Threshold Voltage," which is incorporated by reference herein in its entirety.

This application is also related to U.S. patent application Ser. No. 10/218,010, filed Aug. 13, 2002, now U.S. Pat. No. 6,734,495, which is also incorporated by reference herein in its entirety.

The present invention relates generally to MOS-gated devices, and more specifically to MOS-gated device fabrication techniques and structures.

BACKGROUND OF THE INVENTION

Metal-Oxide-Semiconductor Field Effect Transistors (MOSFETs) are a type of transistor having a layer of dielectric between a conductive gate and a semiconductor region. MOSFETs may be designed to operate in enhancement mode or depletion mode. Enhancement mode MOSFETs operate by creating a conductive channel through inversion of the semiconductor surface underneath the gate, that is, by applying a voltage to the gate electrode and creating a region in the semiconductor where the concentration of "minority" carriers (holes in the case of n-type semiconductors, and conduction electrons in the case of p-type semiconductors) is increased until it exceeds the equilibrium concentration of "majority" carriers (by contrast, a depletion mode device operates by applying a voltage to a gate, and reducing the number of carriers to a value lower than the equilibrium value in an already present conductive channel). The conductive channel so created typically extends laterally or vertically between the source and the drain of the device.

Power MOSFETs are a type of MOSFET designed to handle high voltages and/or high currents. In one type of power MOSFET—a double diffused MOSFET (DMOS)—the body and source regions are diffused from the same edge. DMOS devices may be either lateral or vertical devices, depending on whether the current flow between the source and drain is lateral or vertical, respectively. Vertical DMOS technology is used to fabricate a variety of device types, including high voltage and high current transistors and IGBTs (Insulated Gate Bipolar Transistors). The large majority of these vertical DMOS devices are n-channel rather than p-channel devices, due to the lower on-resistance or voltage drop per unit area afforded by n-channel devices as compared to p-channel devices. This lower on-resistance or voltage drop per unit area is a result of the higher mobility of conduction electrons in silicon compared to that of holes.

As with other MOSFETs, vertical DMOS devices may be enhancement mode or depletion mode devices. In an n-channel enhancement mode device, the threshold voltage of the device—that is, the voltage required to be applied to the gate in order to create a conductive channel between the source and the drain, which is also the voltage necessary to effect inversion—is typically chosen to be sufficiently positive with respect to the source voltage to allow the device to be fully "off" with 0 volts present between the gate and the source. In an n-channel depletion mode device, by contrast, the threshold voltage is typically chosen to be sufficiently negative with respect to the source voltage to allow the device to be fully "on" with 0 volts present between the gate and the source. In depletion mode n-channel devices, the conductive channel in the device is typically formed either by introducing n-type dopant at the surface of the body region which produces a permanent channel region with no gate-to-source voltage, or by implanting permanently charged ions into the gate dielectric which induce a channel at the surface of the underlying body region when there is no gate-to-source voltage.

A conventional vertical DMOS is illustrated in FIG. 1. Devices of this type are described, for example, in R. Locher, "Introduction to Power MOSFETS and Their Applications", National Semiconductor Application Note 558 (December 1988). The device 1 consists of an n⁺ substrate 2, on one surface of which is disposed an epitaxial layer 3 and on the other surface of which is disposed a metal layer 5 which serves as a drain contact having a drain terminal 6. A deep body region 7 is in electrical contact with a source and body terminal 4 and is formed in the epitaxial layer. In the device illustrated, the shallower diffused region 10 is a p body region and the deeper diffused region is a p⁺ body region. A portion 13 of the p body region extends underneath the gate between the n⁺ source region 9 and the drain region 21 and is capable of undergoing inversion to form a channel.

A conductive polysilicon gate 15 is disposed over the channel. The gate is surrounded by a dielectric material 17 (typically SiO₂). The portion of this dielectric material below the gate is referred to as the gate dielectric. A layer of source and body metal 19 is disposed over the gate and the epitaxial layer, but in contact with just the source and body regions.

When the gate is biased positive with respect to the source and there is an applied drain-to-source voltage, the holes in the p-type body region 13 are repelled away from the gate area and conduction electrons are drawn towards it, thus inverting the p-type body regions underneath the gate. This gate-to-source voltage creates a path or channel so that carriers from the source can flow to the drain region at the surface below the gate, and then vertically through drain region 21, and to the n⁺ substrate 2. The vertical geometry of these devices allows lower on-state resistances for the same blocking voltage and faster switching than is possible in comparable lateral MOSFETS.

The threshold voltage of both enhancement mode and depletion mode DMOS devices varies from one device to another. The degree of threshold voltage variation across a group of devices is determined by a variety of manufacturing variables, including the exact doping profile in the body region, the gate dielectric thickness and composition, and the composition of the gate conductor. In typical switching applications, variations in the manufacturing threshold voltage do not present a problem with respect to enhancement mode DMOS devices, because the drive signal is chosen to turn the device fully "on" or fully "off". However, while depletion mode DMOS devices may be employed in a similar manner, the current verses voltage characteristics of depletion mode DMOS devices (see FIG. 2) for an n-channel DMOS transistor also allows them to be used in a two terminal configuration in applications that require a specific current with zero volts between the gate and the source. Only two terminals are required in such a configuration, because the gate is electrically connected to the source. Some of these applications are described, for example, in S. Ochi, "Semiconductor Current Regulators Protect Circuits", PCIM, Vol. 26, No. 1, p. 63 (January 2000). In many of these applications, the ability to provide a specific current (within the limits of design specifications) is essential to their use.

However, due to the above noted variations in threshold voltages of DMOS devices, the current that flows with zero volts between the gate and source may vary significantly even among devices manufactured using the same process flow.

There is thus a need in the art for depletion mode MOS-gated devices having a threshold voltage that may be adjusted so as to provide a desired current flow with zero volts between the gate and the source. There is also a need in the art for methods for making such devices and for adjusting the threshold voltages thereof. These and other needs are met by the present invention, as hereinafter described.

SUMMARY OF THE INVENTION

In a first aspect, the present invention relates to a transistor comprising a floating gate, a programming electrode, a dielectric material, a source, a body and a source/body metallization layer which is in electrical contact with the source and body, and also serves as a gate of the device. The source/body contact and gate metal layer serves as a reference voltage for the floating gate. The threshold voltage of the transistor is adjustable from an initial voltage $V_0$ to a new voltage $V_n$, wherein $|V_0-V_n|>0$ and $V_n<0$ (in an n-channel device) by causing electrons to tunnel through a dielectric material so as to change the net electric charge on the floating gate. Preferably, $|V_n|$ is at least 0.1 volts, and more preferably is within the range of about 1.0 to about 10.0 volts. The transistor is preferably a MOSFET, and more preferably a lateral or vertical power MOSFET. In the preferred embodiment, the dielectric material, which may be, for example, an oxide layer, a nitride layer, or a composite dielectric layer, is disposed between the floating gate and one of the programming electrodes, and is sufficiently thin (e.g., less than about 250 Å, and more preferably within the range of about 50 to about 250 Å) to allow Fowler-Nordheim tunneling or other types of field assisted electron tunneling between the floating gate and this programming electrode. The source employed in an n-channel transistor is preferably an $n^+$ source. The transistor also preferably comprises double diffused source and body regions.

A second aspect of this invention differs from the first aspect only in that the metallization layer which is in electrical contact with the source and body does not also serve as the gate of the device. The gate is a separate region that can be independently biased with respect to the source and body.

In certain variations of the above noted aspects of the present invention, the thin dielectric layer where tunneling occurs can be disposed between the source/body metallization layer and the floating gate, between the floating gate and a separate poly programming layer, between either an n-doped or a p-doped region of silicon and the floating gate, or between the device gate and the floating gate. In all instances there is both a top and bottom programming electrode. In these variations, tunneling is made to occur either between the floating gate and the top programming electrode or between the floating gate and the bottom programming electrode. The programming electrodes are each separated from the floating gate by a dielectric layer. The programming electrode that carriers tunnel to and from is separated from the floating gate by a dielectric layer that is thinner than the dielectric layer separating the floating gate from the other programming electrode.

In another aspect, the present invention relates to a method for adjusting the threshold voltage of a MOS-gated device. In accordance with the method, a MOS-gated device is provided which comprises a floating gate, programming electrodes, dielectric materials, a source and drain, and a source/body metallization layer in electrical contact with the source and body which also serves as a gate for the device. The source/body and gate metal preferably also serves as a reference voltage for the floating gate. The MOS-gated device may be of the type described in the above noted aspects of the present invention. The threshold voltage of the transistor is then adjusted from an initial voltage $V_0$ to a new voltage $V_n$, wherein $|V_0-V_n|>0$, by causing electrons to tunnel through a dielectric material so as to change the net electric charge on the floating gate. This floating gate adjusts the threshold voltage of the device with respect to the reference gate.

In yet another aspect, the present invention relates to a method for adjusting the threshold voltage of a MOS-gated device. In accordance with the method, a MOS-gated device is provided which comprises a floating gate, programming electrodes, dielectric materials, a source and drain, a source/body metallization layer and a gate that is biased with respect to the source/body metallization. The MOS-gated device may be of the type described in the above noted aspects of the present invention. The threshold voltage of the transistor is then adjusted from an initial value $V_0$ to a new voltage $V_n$, wherein $[V_0-V_n|>0$, by causing electrons to tunnel through a dielectric material so as to change the net electric charge on the floating gate. This floating gate adjusts the threshold voltage of the device with respect to the gate.

In still another aspect, a DMOS current source is provided which comprises first and second programming electrodes, a floating gate disposed between the first and second programming electrodes, and a dielectric material disposed between the floating gate and at least one of said first and second programming electrodes. The threshold voltage of the DMOS current source is adjustable from an initial voltage $V_0$ to a new voltage $V_n$ by applying a voltage between said first and second programming electrodes sufficient to cause charged carriers to tunnel through the dielectric material so as to change the net electric charge on said floating gate, and wherein $|V_0-V_n|>0$.

In yet another aspect, a MOSFET is provided which comprises first and second electrodes, a floating gate disposed between the first and second electrodes, and a dielectric material disposed between the floating gate and the first electrode. The thickness of the dielectric material disposed between the floating gate and the first electrode is within the range of about 50 Å to about 250 Å, and preferably within the range of about 80 Å to about 200 Å.

In another aspect, a MOSFET is provided which comprises first and second electrodes, a floating gate disposed between the first and second electrodes, and a dielectric material disposed between the floating gate and the first electrode. The threshold voltage of the MOS-gated device is adjustable by applying a sufficient voltage across said first and second electrodes.

These and other aspects of the present invention are described in further detail below, and with frequent reference to an n-channel DMOS device as an example.

DETAILED DESCRIPTION

In accordance with the present invention, a depletion mode MOS-gated device, which is preferably a DMOS device and even more preferably a 2-terminal DMOS device, is provided which has a threshold voltage that may be adjusted to provide a precise current with a specific gate-to-source voltage present. The threshold voltage adjustment step can be advantageously effected after the device fabrication sequence has been completed. The precise current that flows may be set either at the wafer level prior to assembly by the device manufacturer, or by the device manufacturer or the user when the device is in its package. This depletion mode MOS-gated device may use one of various techniques known to the art to provide the initial depletion mode characteristics, and may then use one of the techniques of this invention to obtain the precise current value. Alternatively, one of the techniques of this invention may be used by itself to produce both the depletion mode characteristics and the precise current value. Techniques for adjusting the threshold voltage of DMOS devices to obtain a precise current in a two terminal configuration, and methods for manufacturing these devices, are hereinafter described.

A two-terminal current source may be fabricated using a three-terminal depletion mode vertical DMOS transistor by electrically connecting the source/body and gate terminals. However, since no voltage will ever be applied between the source/body electrode and the gate electrode, it is possible to combine the functions of these two electrodes into a single electrode as shown in U.S. Pat. No. 5,956,582 (Ayela et al.). In one embodiment, the present invention places a floating gate which has a precise amount of charge on it between a combined source/body and gate metal and the region of the body where the channel is formed.

Figure 1:
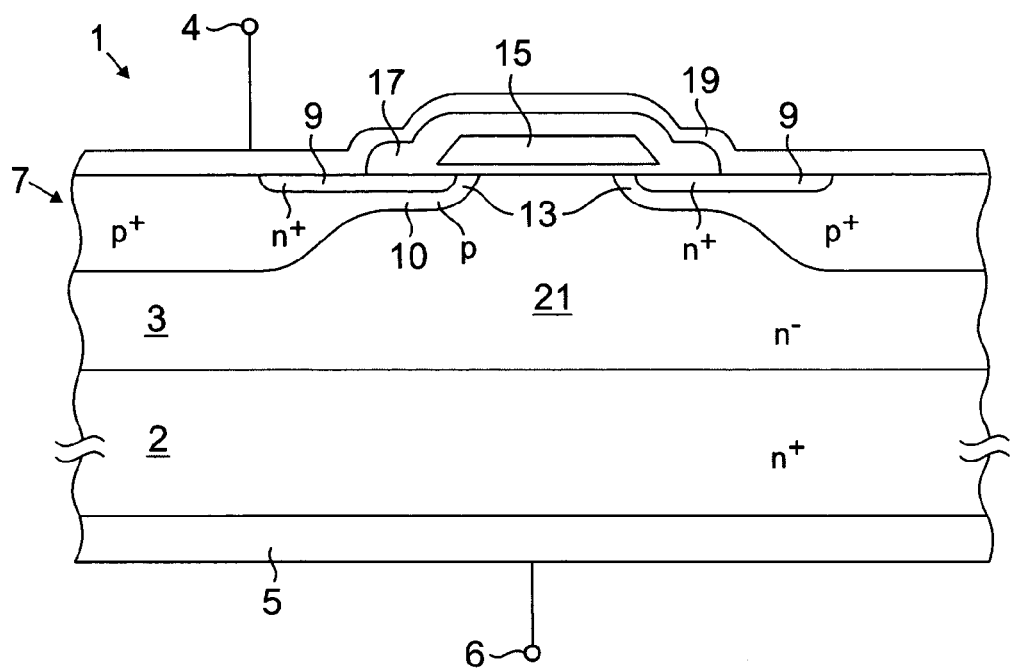
FIG. 1 is a schematic drawing depicting the structure of a conventional DMOS transistor.
Figure 2:
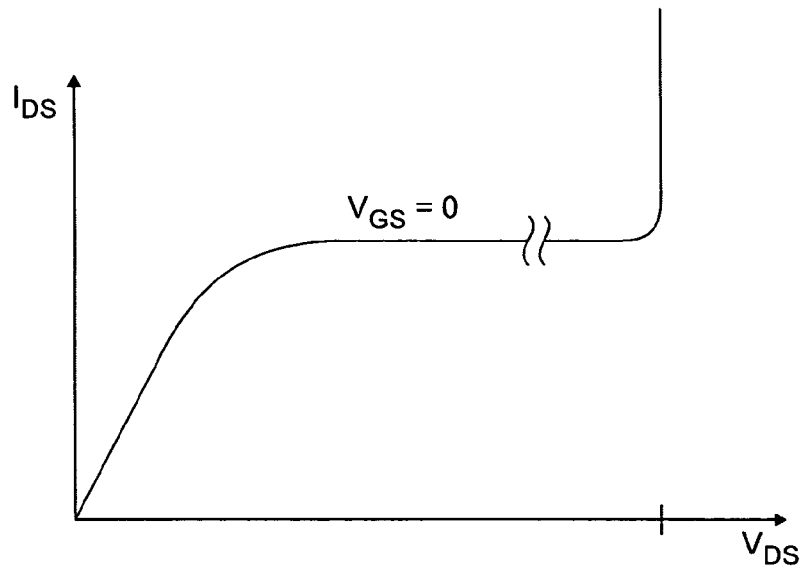
FIG. 2 is a graph of current as a function of voltage characteristic for a two-terminal depletion mode n-channel DMOS transistor.
Figure 3A:
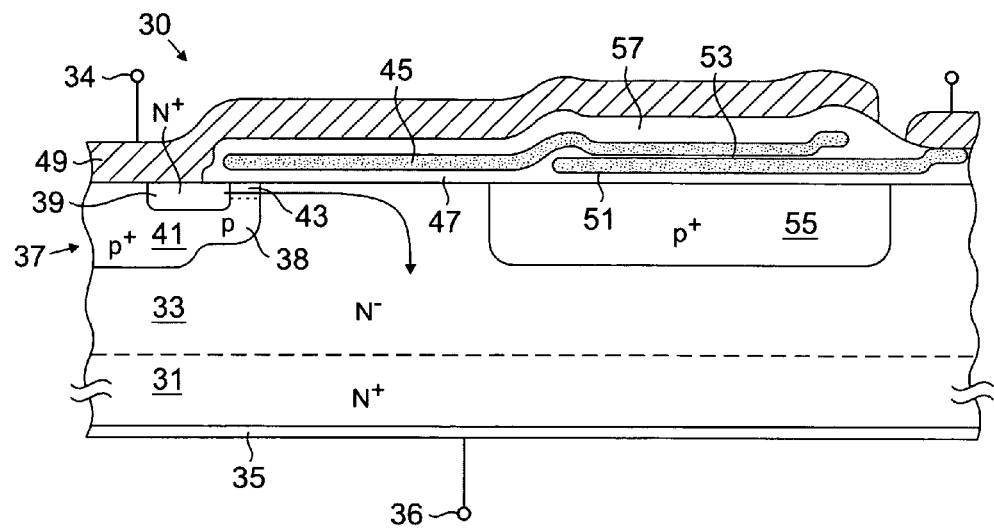
FIG. 3a is a cross-sectional view of an embodiment of a DMOS programmable current source in accordance with the present invention with two poly layers and a tunnel oxide disposed between the bottom programming electrode and the floating gate, and in which the top programming electrode is also the source/body and gate metal.
Figure 3B:
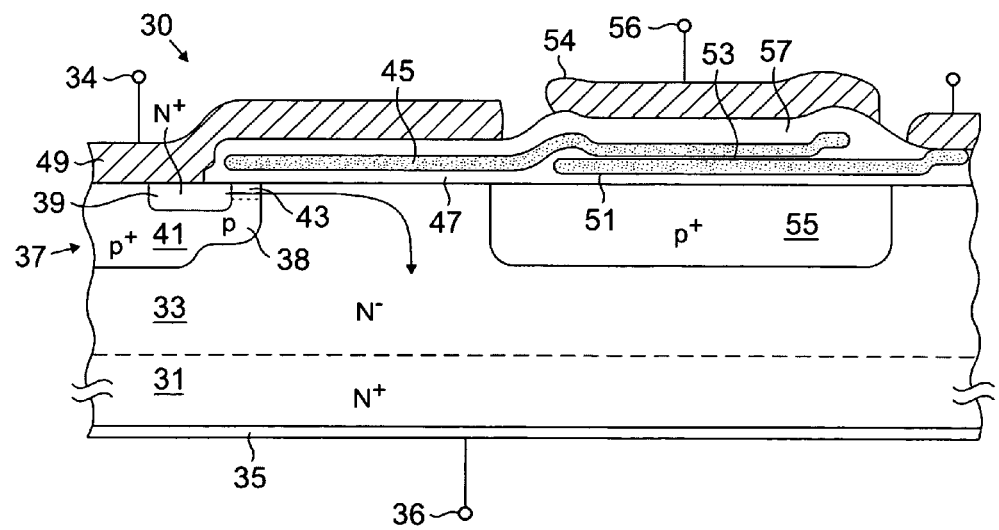
FIG. 3b is a cross-sectional view of an embodiment of a DMOS programmable current source in accordance with the present invention with two poly layers and a tunnel oxide disposed between the top programming electrode and the floating gate, and in which the top programming electrode is separate from the source/body and gate metal.

A first example of a transistor made in accordance with the present invention is depicted in FIGS. 3a and 3b. The device depicted therein is a vertical DMOS structure 30 which consists of an n+ substrate 31, on one surface of which is disposed an epitaxial layer 33 and on the other surface of which is disposed a metal layer 35 which serves as a drain electrode. The device is also provided with a drain lead 36. A body 37 is implanted in the surface of the epitaxial layer, and consists of a shallower diffused region 38 and a deeper diffused region 41. In the device illustrated, the shallower diffused region is a p body region and the deeper diffused region is a p+ body region. The deeper diffused region and the shallower diffused region may be formed by ion implantation with boron. The shallower diffused source region 39 may be formed by ion implantation with phosphorus, antimony or arsenic. A polysilicon floating gate 45 is disposed over the channel and is surrounded by gate dielectric material 47 such as silicon dioxide or silicon nitride. A portion 43 of the p body region extends underneath the floating gate and is capable of undergoing inversion to form a channel. A layer of body/source contact and gate metal 49 (which also serves as the top programming electrode) is disposed over the floating gate and has a lead 34.

FIGS. 3a and 3b depict only one side of the gate region with a source, body and channel. This surface geometry is only one of a large number of geometries, which are well known in the art, that may be used in a device made in accordance with the teachings of the present invention. Thus, it is to be understood that the present invention contemplates, for example, devices with only one channel region as well as devices with two or more channel regions near the programming electrode. These devices may have surface geometries that may be cellular, interdigitated, meshed, and so forth.

When the floating gate has a positive charge with respect to the source, the holes in the p-epitaxial layer are repelled away from the gate area while conduction electrons are attracted, thus inverting the p-layer underneath the gate. The charge on the gate creates a current path or channel 43 so that source carriers flow underneath the gate to the drain region and then vertically through the drain. The vertical structure and current flow of these devices enables lower on-state resistances for the same blocking voltage and faster switching than comparable lateral MOSFETS, since the depletion region spreads vertically into the epitaxial layer, using less surface area and having less capacitance.

The combination of the body/source contact gate metal and the floating gate of FIGS. 3a and 3b differs in some important respects from gates in conventional devices. First of all, while the gate in a conventional device is typically in electrical contact with either an electrode or an electrical lead, in the device of FIGS. 3a and 3b, one gate is an electrically floating gate. This floating gate can be negatively or positively biased (e.g., made to carry a net negative or positive charge) with respect to the body/source contact and gate metal, by imparting a charge to it through the use of the bottom programming electrode 51 which extends underneath the floating gate. The bottom programming electrode, which can be made from the same materials as the floating gate, is placed in electrical contact with the top programming electrode (here, the source/body contact and gate metal) after the programming step occurs. The p+ region 55 serves as a perimeter region in device 30 to maximize the breakdown voltage, and is electrically continuous with the p+ body region 41.

In FIGS. 3a and 3b, the bottom programming electrode is separated from the floating gate by a thin layer 53 of dielectric material, which may comprise, for example, silicon oxide, silicon nitride or a composite dielectric film. This thin layer has a thickness which is typically less than about 250 Å and more preferably within the range of about 50 to about 250 Å. It may be referred to as the "tunneling dielectric", because its thickness and other characteristics are carefully selected to permit field assisted tunneling mechanisms, such as Fowler-Nordheim tunneling, to occur between the floating gate and the bottom programming electrode when a sufficient voltage (the programming voltage) is applied between the top and bottom programming electrodes. This condition results in the placement of a charge on the floating gate, thus allowing the threshold voltage of the device to be programmed by controlling the amount of charge on the floating gate. The thickness of the dielectric layer 57 between the floating gate and the top programming electrode (the source/body and gate metal) is typically about 3 to about 10 times thicker than the tunnel dielectric layer 53 (e.g., it is typically within the range of about 150 to about 2500 Å).

In FIGS. 3a and 3b, the bottom electrode serves as the "tunneling electrode" (that is, it is involved in the tunneling of charge carriers between itself and the floating gate). The top programming electrode, on the other hand, serves primarily in the role of a "reference electrode" in these two configurations (thus, for programming purposes, it functions primarily to define the programming voltage).

Figure 3C:
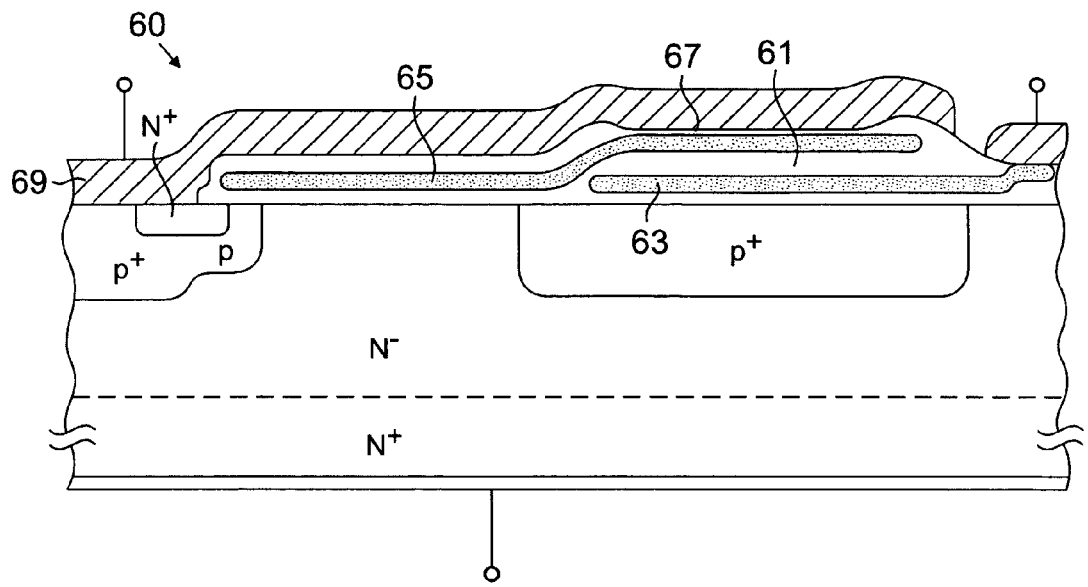
FIG. 3c is a cross-sectional view of an embodiment of a DMOS programmable current source in accordance with the present invention which has two poly layers and a tunnel oxide disposed between the floating gate and the source metal, and in which the top programming electrode is also the source/body and gate metal.
Figure 3D:
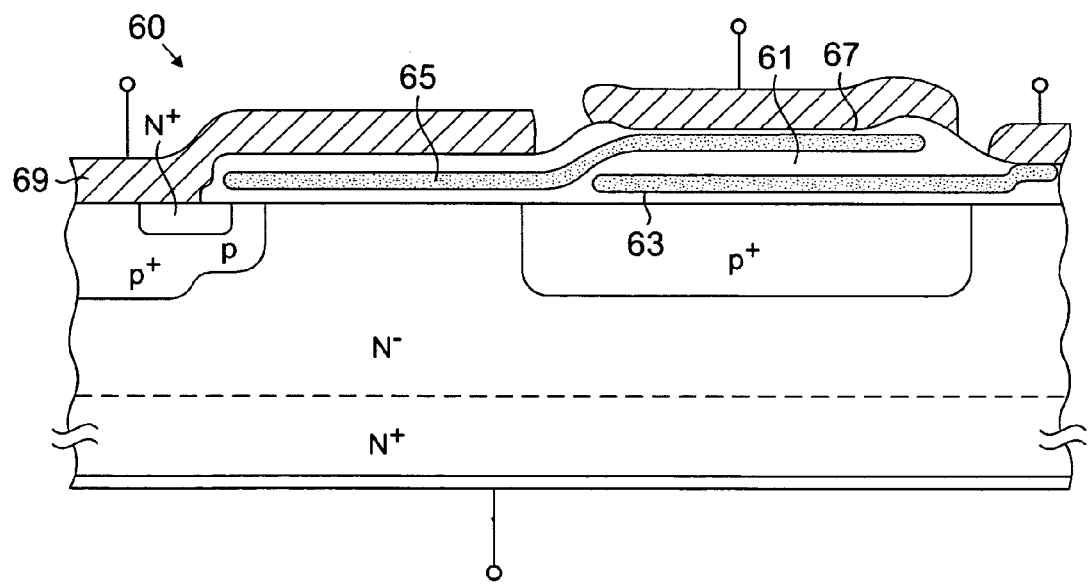
FIG. 3d is a cross-sectional view of an embodiment of a DMOS programmable current source in accordance with the present invention which has two poly layers and a tunnel oxide disposed between the floating gate and the source metal, and in which the top programming electrode is separate from the source/body and gate metal.

By contrast, in the devices of FIGS. 3c and 3d, which illustrate further embodiments of the devices disclosed herein, the top programming electrode 65 serves as the tunneling electrode, and the bottom programming electrode 63 serves as a reference electrode. Moreover, while the devices 60 of FIGS. 3c and 3d are similar to those depicted in FIGS. 3a–b in many other respects, the dielectric layer 61 in these devices between the bottom programming electrode 63 and the floating gate 65 is thicker, e.g., by about 3 to about 10 times, than the dielectric layer 67 disposed between the top programming electrode 65 and the floating gate. As with the embodiments of FIGS. 3a and 3b, the dielectric layer 67 between the tunneling electrode and the floating gate is sufficiently thin (typically in the range of about 50 to about 250 Å) to allow tunneling between the tunneling electrode and the floating gate to occur for the purposes of programming the threshold voltage.

Fowler-Norheim tunneling and other field assisted electron tunneling mechanisms, including channel hot electron injection and source-side injection, are known to the art and are described, for example, in W. Brown, J. Brewer "Non-Volatile Semiconductor Memory Technology—A Comprehensive Guide to Understanding and Using NVSM Devices", pp. 10–17 (1998). These various field assisted electron tunneling mechanisms may be used to change the amount of charge on a floating gate in devices made in accordance with the present invention.

Fowler-Nordheim tunneling may be characterized by the Fowler-Norheim current density, which is given by EQUATION 1:

$$J = \alpha E_{inj}^2 \exp\left[\frac{-E_c}{E_{inj}}\right] \text{ where} \quad \text{(EQUATION 1)}$$

$$\alpha = \frac{q^3}{8\pi h \phi_b} \frac{m}{m^*} \text{ where} \quad \text{(EQUATION 2)}$$

$$E_c = 4\sqrt{2m^*} \frac{\phi_b^{3/2}}{3\hbar q} \quad \text{(EQUATION 3)}$$

and wherein $h$ = Planck's constant $\phi_b$ = the energy barrier at the injection interface, or 3.2 eV for Si-SiO$_2$ $E_{inj}$ = the electric field at the injecting interface $q = 1.6 \times 10^{-19} C$ (the charge of a single electron)

$m = 9.1 \times 10^{-31}$ kg (the mass of a free electron)

$m^* =$
    0.42 m (the effective mass of an electron in the band gap of SiO$_2$)

$\hbar = \frac{h}{2\pi}$

From EQUATION 1, it can be seen that the Fowler-Nordheim tunneling current density is almost exponentially dependent on the applied field.

EQUATION 1 is a simplified version of the Fowler-Norheim current density. Other versions of the current density expression may also be used which may include, for example, correction factors for image force barrier lowering and the influence of temperature. However, EQUATION 1 is typically adequate for characterizing Fowler-Nordheim tunneling in the devices of the present invention.

As noted above, the tunneling dielectric preferably has a thickness within the range of about 50 to about 250 Å. This range holds for oxides which are thermally grown on monocrystalline silicon. However, in some embodiments of the present invention, the tunneling oxides may be grown instead on polysilicon. The use of such oxides, which are referred to as "polyoxides", results in a field at the injecting surface which is much larger than that for an oxide grown on monocrystalline silicon. Consequently, a tunneling dielectric layer of increased thickness may be used, which is advantageous in that it may be grown much more reliably. Moreover, through the use of a polyoxide tunneling dielectric, considerable current levels can be attained at moderate average oxide field levels, and thus, at moderate applied voltages. This increased thickness improves the reliability of the device, since the tunneling oxides are not stressed by large fields during programming, thereby avoiding dielectric breakdown failures.

The programming of the threshold voltage of the device of FIGS. 3a and 3b will typically be accomplished after the device is fabricated. The threshold voltage of the device can be negatively biased by causing electrons to tunnel through the tunnel oxide layer from the floating gate to the bottom programming electrode, using the two programming electrodes to supply the voltage. In FIG. 3a, the top programming electrode is the source/body and gate electrode, while in FIG. 3b, the top programming electrode 54 is separate from the source/body and gate electrode and has its own lead 56.

The resulting net positive charge on the floating gate produces a negative shift in the threshold voltage of the DMOS device. Of course, it will be appreciated that electrons may also be made to tunnel through the tunnel oxide layer from the bottom programming electrode to the floating gate, thereby imparting a net negative charge to the gate and producing a positive shift in the threshold voltage of the DMOS device. The threshold voltage shift may be monitored by measuring the current flow between the drain and the source while programming. When the desired current flow value is obtained, programming is stopped.

Once programmed, the threshold voltage of the device will remain unchanged so long as the voltage between the two programming electrodes does not exceed the programming voltage. There are at least two ways of ensuring that this condition is met when the device is intended as a permanently programmed, two terminal current source:

(1) The two programming electrodes may be connected together during assembly using bonding wires between these two regions, or by bonding these two regions to a common point; or (2) The two programming electrodes may be bonded to separate leads of the package, and these leads may be connected outside the package.

A device manufactured in accordance with the invention can have the current that it supplies programmed to a precise value. Moreover, this value can be changed so long as the programming electrode is not permanently connected to the source/body contact and gate metal. The amount of charge on the floating gate may be increased or decreased by placing the appropriate voltage between the top programming electrode and the bottom programming electrode, thereby changing the amount of charge present on the floating gate.

Figure 4A:
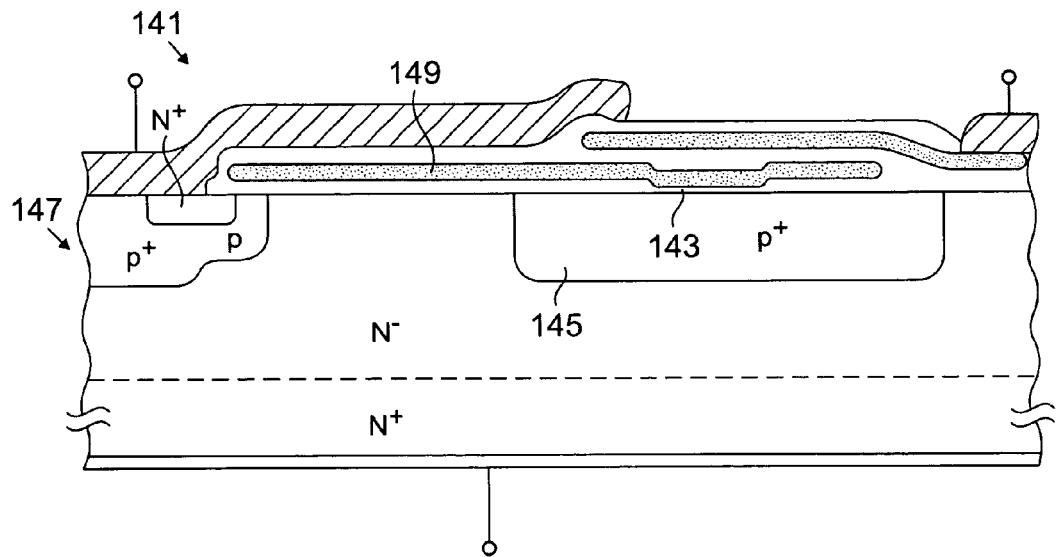
FIG. 4a is a cross-sectional view of an embodiment of a DMOS programmable current source in accordance with the present invention which has two poly layers and a tunnel oxide between a doped region of the substrate and the floating gate.
Figure 4B:
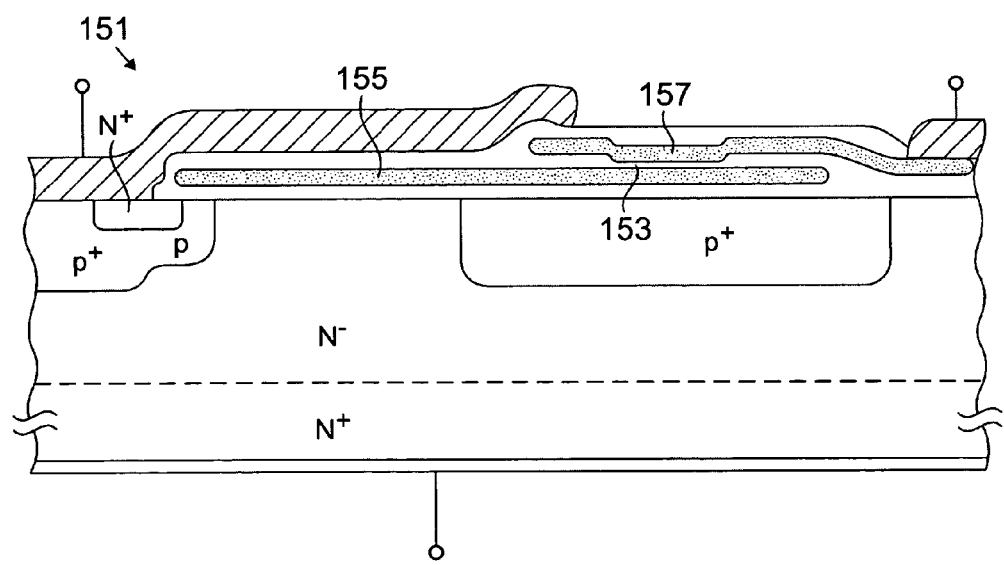
FIG. 4b is a cross-sectional view of an embodiment of a DMOS programmable current source in accordance with the present invention which has two poly layers and a tunnel oxide between the two poly layers.

FIGS. 3a-d shows the polysilicon programming electrode between the silicon substrate and the floating gate. However, this configuration could be reversed as shown in FIGS. 4a-b, by placing the floating gate between the silicon substrate and the polysilicon programming electrode. Two additional double poly structures result. In the first structure 141 shown in FIG. 4a, the tunneling dielectric 143 is disposed between a doped region 145 of the substrate 147 and the floating gate 149. The doped region in this embodiment acts as a programming electrode. In the second structure 151, shown in FIG. 4b, the tunneling dielectric 153 is between the floating gate 155 and the polysilicon programming electrode 157 disposed above it. In the structures depicted in FIGS. 4a and 4b, the source/body contact and gate metal serves as the bottom electrode for programming purposes.

Other embodiments of this invention require only one layer of poly, which is the floating gate that the threshold-adjusting charge resides on. Possible structures for fabricating programmable current sources with only one poly layer are described in TABLE 1.

TABLE 1

Possible Structures for Single Poly Programmable Current Sources

| Top Programming Electrode | Bottom Programming Electrode | Location Tunnel Dielectric | Physically Separate p+ Diffusion required for Electrode | n+ Diffusion Inside of p+ Diffusion | Process Issues or Concerns |
|---|---|---|---|---|---|
| Dedicated metal | p+ diffused region | Below floating gate | No | No | — |
| Dedicated metal | p+ diffused region | Above floating gate | No | No | — |
| Source/body and gate metal | p+ diffused region | Below floating gate | Yes | No | Spacing of p+ diffused regions |
| Source/body and gate metal | p+ diffused region | Above floating gate | Yes | No | Spacing of p+ diffused regions |
| Source/body and gate metal | p+ diffused region containing an n+ region | Below floating gate | Yes | Yes | Spacing of p+ diffused regions |
| Source/body and gate metal | p+ diffused region containing an n+ region | Above floating gate | Yes | Yes | Spacing of p+ diffused regions |
| Dedicated metal | p+ diffused region containing an n+ region | Below floating gate | No | Yes | — |
| Dedicated metal | p+ diffused region containing an n+ region | Above floating gate | No | Yes | — |

The embodiments described in TABLE 1 can be better understood by referring to FIGS. 5a–8d, which are discussed below.

Figure 5A:
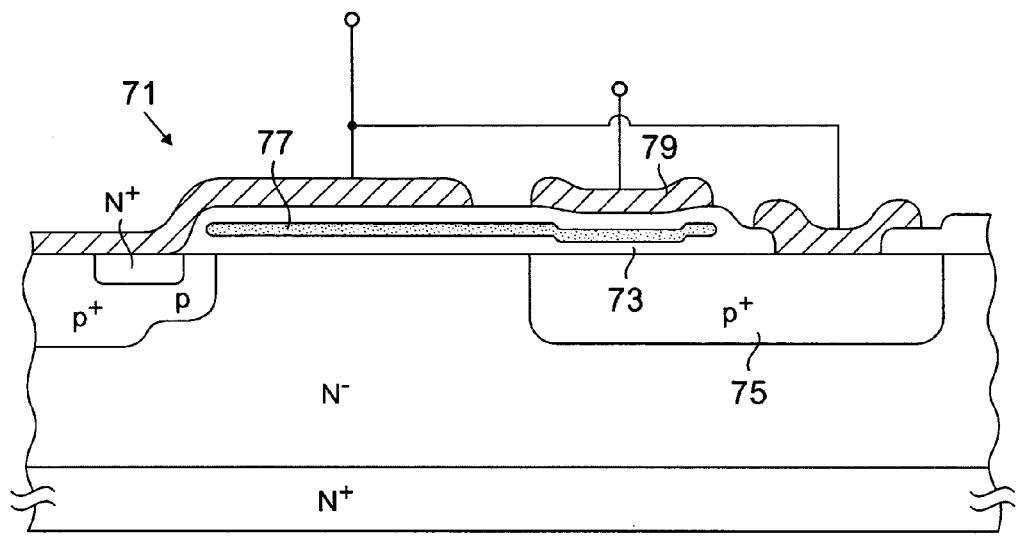
FIGS. 5a–b are cross-sectional illustrations depicting two versions of a single poly programmable current source structure with a metal top programming electrode and a p+ diffused region as the bottom electrode.
Figure 5B:
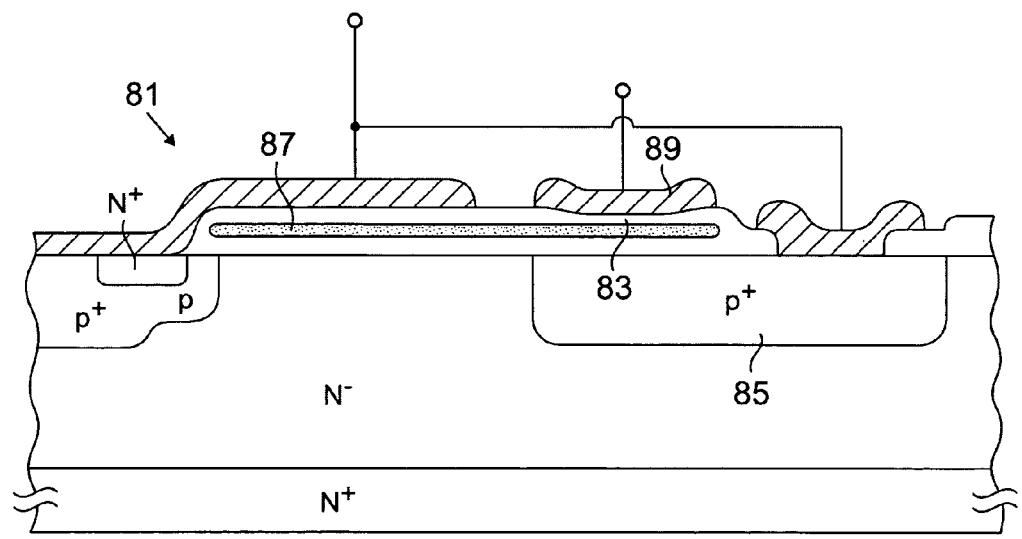

FIGS. 5a and 5b show two versions of a single poly programmable current source structure with a separate metal programming electrode. These devices are similar in most other respects to the device of FIG. 3. In the device 71 of FIG. 5a, the tunnel dielectric 73 is disposed between the p+ diffused region 75 and the floating gate 77. A separate metal programming electrode 79 is disposed above the p+ diffused region. In the device 81 of FIG. 5b, by contrast, the tunnel dielectric 83 is disposed between the metal programming electrode 89 and the floating gate 87. In FIG. 5a, region 75 forms the tunneling electrode and metal 79 is the reference electrode. In FIG. 5b, electrode 89 is the tunneling electrode while region 85 forms the reference electrode.

Figure 6A:
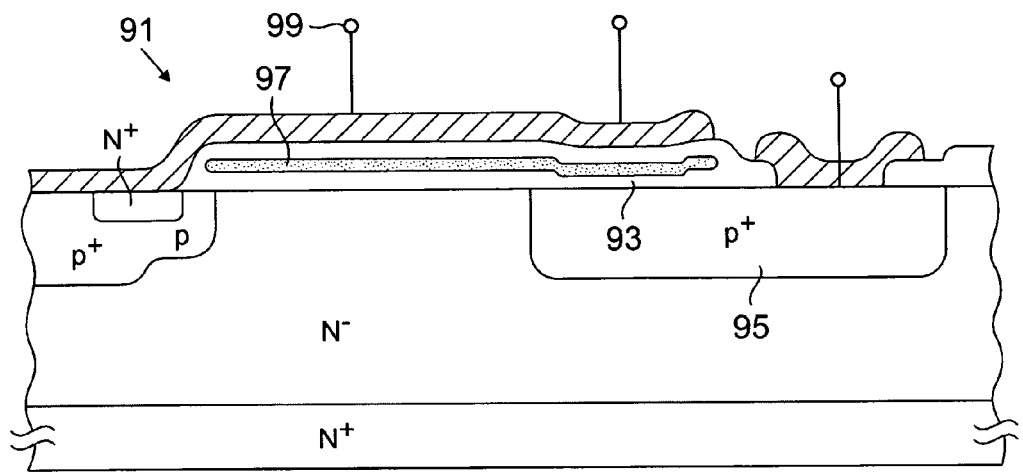
FIGS. 6a–b are cross-sectional illustrations depicting two versions of a single poly programmable current source with the source/body and gate metal as a top programming electrode, and a separate p+ diffused region for a bottom programming electrode.
Figure 6B:
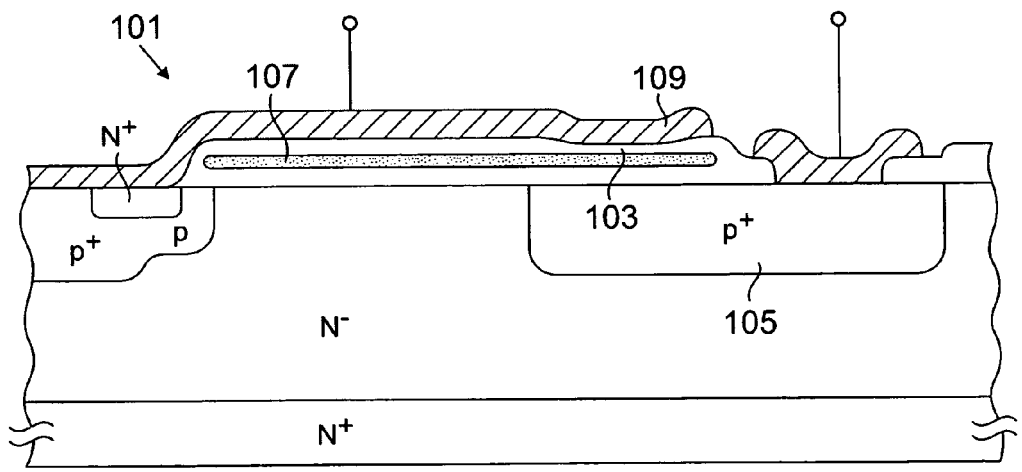

FIGS. 6a and 6b show two versions of a single poly programmable current source structure with a physically separate p+ diffused region for one of the programming electrodes. In the device 91 of FIG. 6a, the tunnel dielectric 93 is disposed between the p+ diffused region 95 and the floating gate 97. In the device 101 of FIG. 6b, by contrast, the tunnel dielectric 103 is disposed between the metal programming electrode 109 and the floating gate 107. In FIG. 6a, p+ diffused region 95 is the tunneling electrode and the source/body and gate metal 99 is the reference electrode. In FIG. 6b, metal electrode 109 serves as both the tunneling electrode and the source/body and gate metal, while the p+ diffused region 105 is the reference electrode. In both versions, a separate p+ diffused region is typically required to be able to place voltages having high enough values to cause carriers to flow onto, and off of, the floating gate. If there was only one p+ diffused region, it would be impossible in a typical construction to obtain a high voltage across the programming electrodes, since they would both be connected to the same p+ diffused region.

Figure 7:
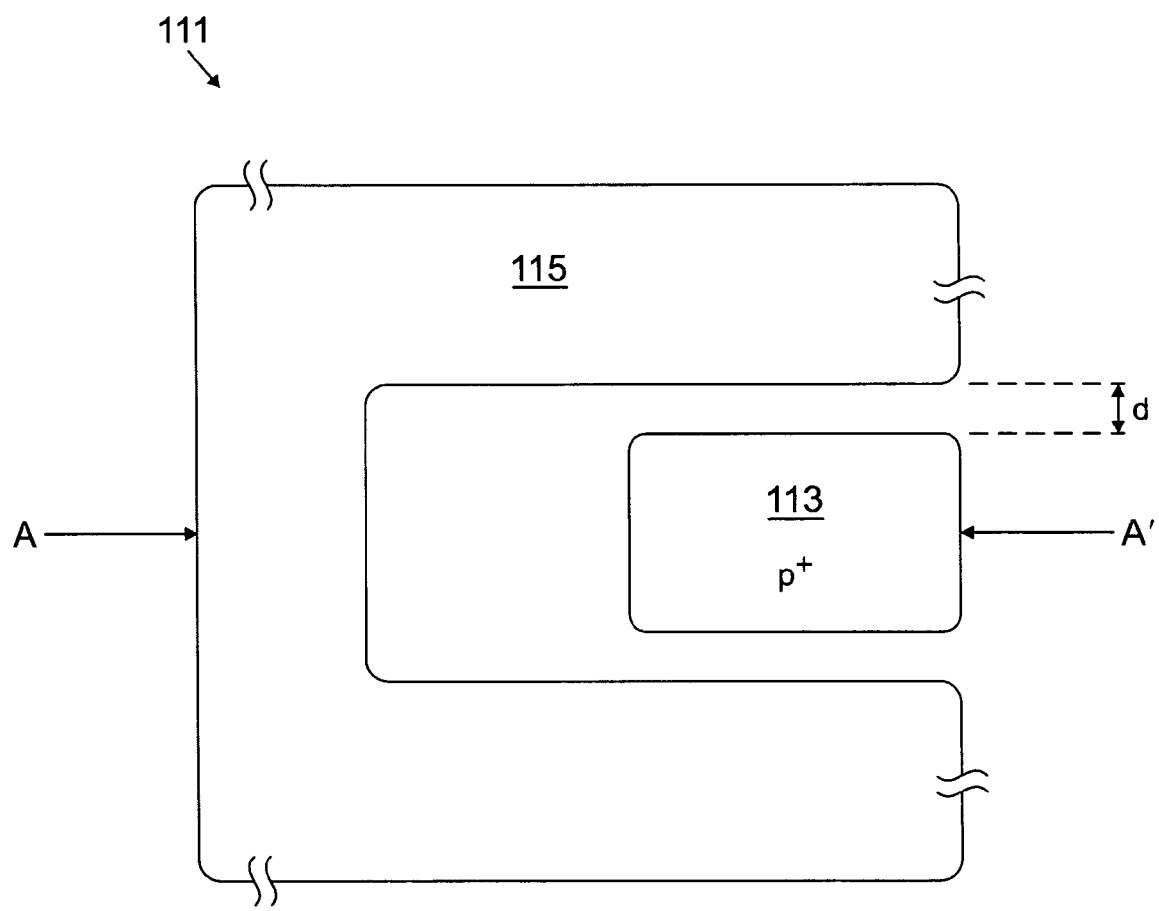
FIG. 7 is a top view of a geometry having a physically separated p+ diffused region for a bottom programming electrode.

FIG. 7 shows a top view of a geometry for a device 111 having a physically separate p+ diffused region 113 for a programming electrode. The Distance "d" between the p+ programming electrode and the main device 115 is chosen so the breakdown voltage is not reduced. The cross-section taken along LINE A—A' in FIG. 7 could correspond, for example, to that of either FIG. 6a or 6b, depending on the location of the programming dielectric.

Figure 8A:
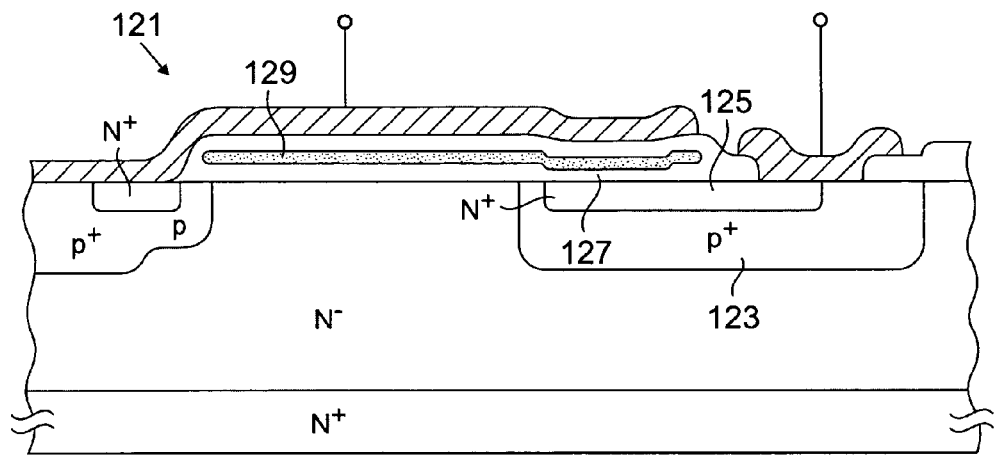
FIGS. 8a–b are cross-sectional illustrations depicting two versions of a single poly programmable current source structure with a physically separate p+ diffused region that contains an n+ diffused region for a bottom programming electrode, and in which the top programming electrode is common with the source/body and gate metal.
Figure 8B:
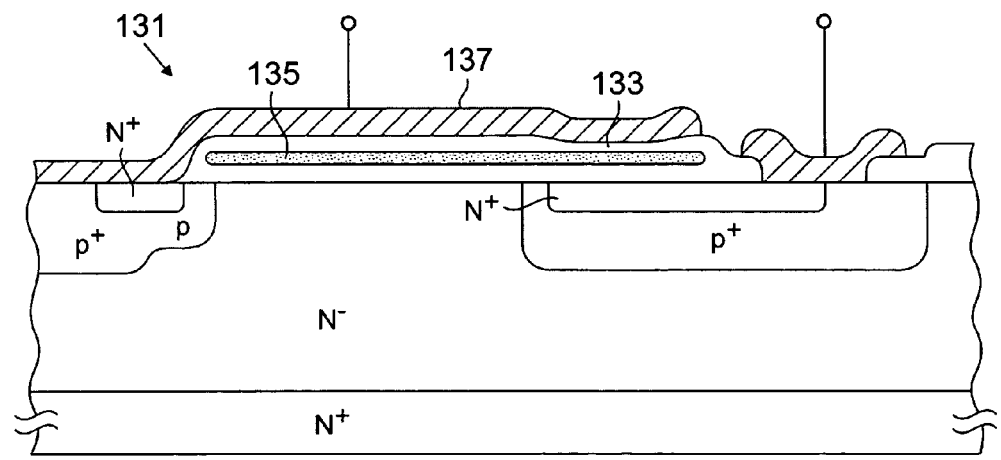

FIGS. 8a through 8d show four versions of a single poly programmable current source structure. The device 121 of FIG. 8a has one programming electrode consisting of a physically separate p+ diffused region 123 that contains an n+ diffused region 125. The separate p+ diffused region is required to allow a high enough voltage to be placed on the programming electrode for tunneling to occur. The n+ diffused region may be required in some situations to provide the electrons that cross the tunnel dielectric 127. The n+ diffused region is disposed below the floating gate 129. The device 131 of FIG. 8b is identical to that of FIG. 8a except that the tunnel dielectric 133 of this device is disposed between the floating gate 135 and the metal programming electrode 137 which is also the source/body and gate metal. These structures may be most easily realized by forming the floating gate after the n+ diffused region is formed. If the n+ diffused region is formed after the floating gate, the region of the floating gate over the n+ diffused region should have a "mesh" or finger structure so that the n+ diffused region is adjacent to and slightly beneath the floating gate due to lateral diffusion.

Figure 8C:
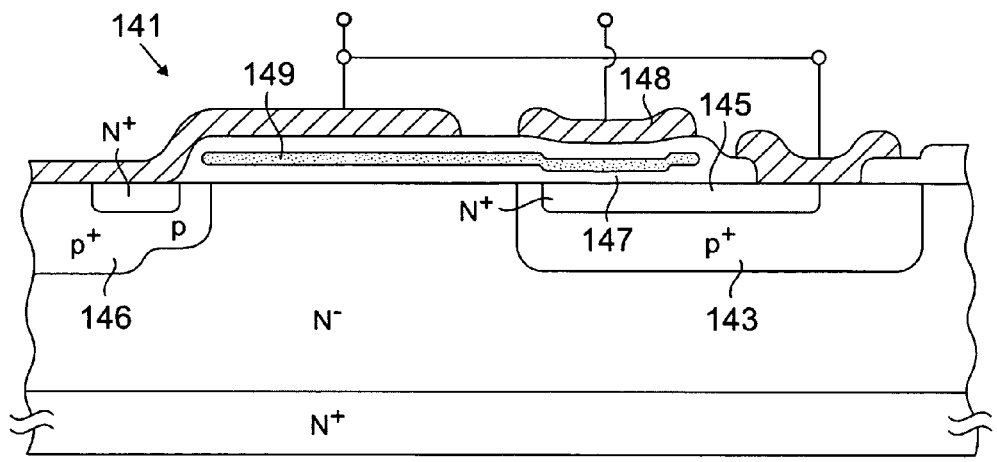
FIGS. 8c–d are cross-sectional illustrations depicting two versions of a single poly programmable current source structure with a physically separate p+ diffused region that contains an n+ diffused region for a bottom programming electrode, and in which the top programming electrode is separate from the source/body and gate metal.
Figure 8D:
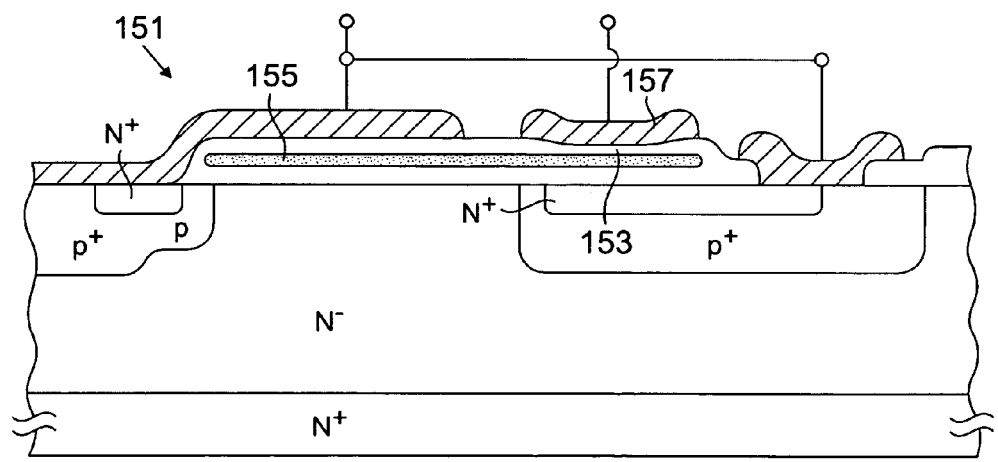

FIGS. 8c and 8d show two additional versions of a single poly programmable current source structure. The device 141 of FIG. 8c has one programming electrode consisting of an n+ diffused region 145 in a p+ diffused region 143. The p+ diffused region 143 is electrically continuous with the other p+ diffused region 146. One programming electrode is the n+ diffused region while the second programming electrode is a dedicated metal electrode 148. The tunnel dielectric 147 is between the n+ diffused region 145 and the floating gate 149. The device 151 of FIG. 8d is identical to that of FIG. 8c except that the tunnel dielectric 153 of this device is disposed between the floating gate 155 and the dedicated programming electrode 157. These structures may be most easily realized by forming the floating gate after the n+ diffused region is formed. If the n+ diffused region is formed after the floating gate, the region of the floating gate over the n+ diffused region should have a "meshed" or finger structure so that the n+ diffused region is adjacent to and slightly beneath the floating gate due to lateral diffusion.

Though not shown in the figures, it is also possible to make the metal programming electrode shown in FIGS. 8c and 8d continuous with the source/body contact and gate metal, thereby eliminating one electrode. However, the p+ to n+ junction limits the voltage that can be placed between the metal electrode and the electrode that contacts the n+ diffused region to 0.6 volts in one direction and to the breakdown voltage of this junction in the other direction, which limits the flexibility of the device. FIGS. 8c and 8d are identical to FIGS. 8a and 8b with the exception that they each have a top programming electrode (148 and 157, respectively) that is physically separated from the source/body and gate electrode.

Devices can be made in accordance with the present invention using a variety of known manufacturing techniques. The fabrication sequences for these devices will typically be similar to the fabrication sequences used in the manufacture of conventional DMOS devices, and may include the deposition, doping, and photomasking of an additional layer of poly silicon for the programming electrode in some embodiments, in addition to an extra photomasking and oxidation sequence to form the tunneling region. These additional steps are described below for embodiments of the invention that use two poly layers, with the tunnel oxide between the two layers of poly.

1. Deposition of a poly silicon "programming" electrode below an area where the floating gate will be formed.

The grain size, texture, geometry, presence of steps, doping concentration, and other features of this poly silicon layer below the tunnel oxide region are controlled to optimize tunneling current.

2. Tunnel oxide region mask and etch.
3. Formation of a thin tunnel dielectric layer on the region of the programming electrode opened by the previous step.

The thickness and other characteristics of this dielectric layer are carefully controlled to allow the threshold voltage to be programmed by adding charge to, or removing charge from, the floating gate.

The floating gate is formed next in this embodiment. In other embodiments of this invention having two poly layers, similar steps are required to form the programming electrode and the floating gate, but the tunnel dielectric is formed between the floating gate and the source/body and gate metal, between the floating gate and the source/body metal, or between the floating gate and a separate metal programming electrode.

For embodiments that use one poly layer, only the additional steps listed below are required.

1. Tunnel oxide region mask and etch.
2. Formation of a thin tunnel dielectric layer on the region of the programming electrode opened by the previous step.

The thickness and other characteristics of this dielectric layer are carefully controlled to allow the threshold voltage to be programmed by adding charge to, or removing charge from, the floating gate.

The floating gate is formed in the next step in this embodiment. In another embodiment of this invention having a single poly layer, the floating gate is formed first and the tunnel dielectric is formed between the floating gate and the source/body contact and gate metal.

Figure 9A:
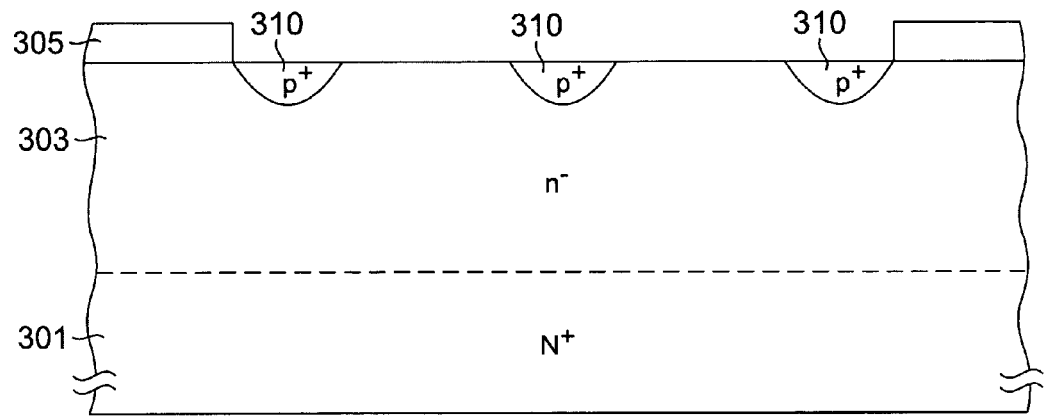
FIGS. 9a–d are cross-sectional views illustrating one possible fabrication sequence that may be used to produce a DMOS device before the additional steps that make the threshold voltage programmable.

FIGS. 9a–d and FIG. 10 illustrate one particular example of a possible sequence of steps that could be used to fabricate a single poly programmable current source in accordance with one embodiment of the present invention with the exception of the masking and oxide growth steps that produce the tunnel oxide. The process, which is depicted in the flow chart of FIG. 10, begins with deposition of an n− epitaxial layer 201 on a wafer substrate, followed by field oxidation 203, p+ masking 205, p+ doping, diffusion and reoxidation 207, and active layer masking and etching 209. The resulting structure after these steps is depicted in FIG. 9a and consists of an n+ wafer 301, an n− epitaxial layer 303 and a layer of silicon oxide 305, which has been masked and etched to form the active region, and p+ diffused regions 310.

Figure 9B:
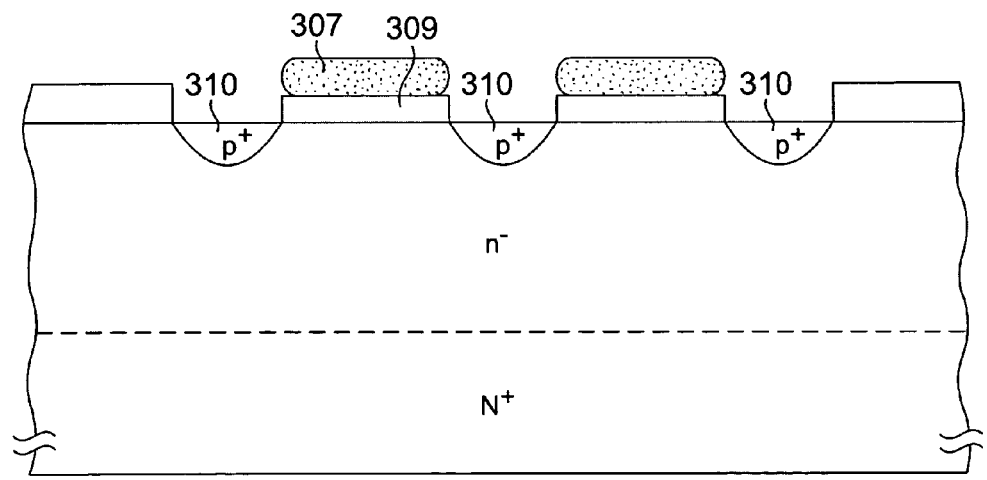
Figure 9C:
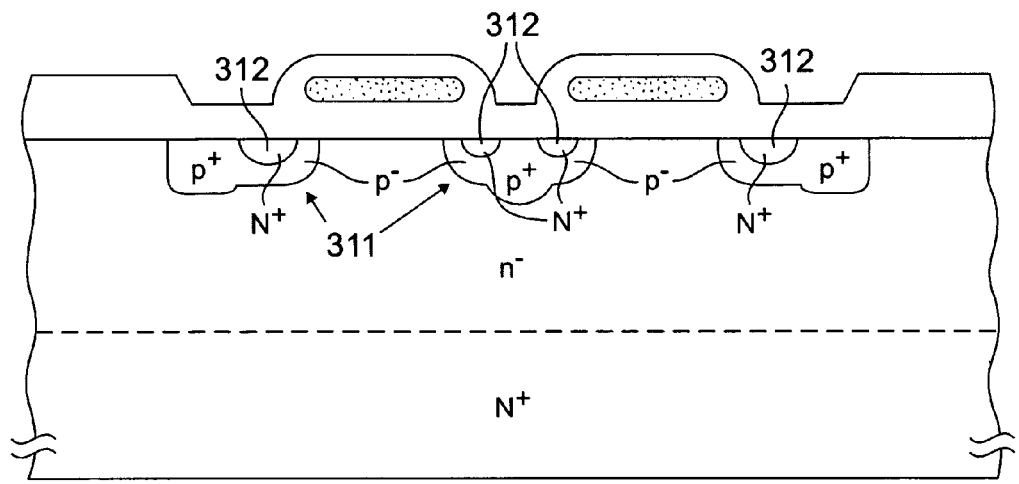
Figure 9D:
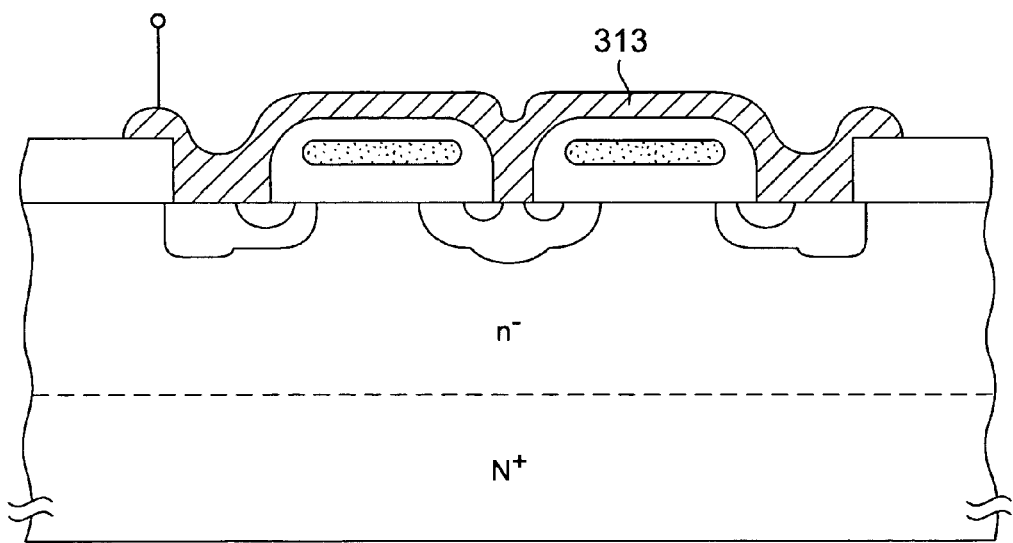
Figure 10:
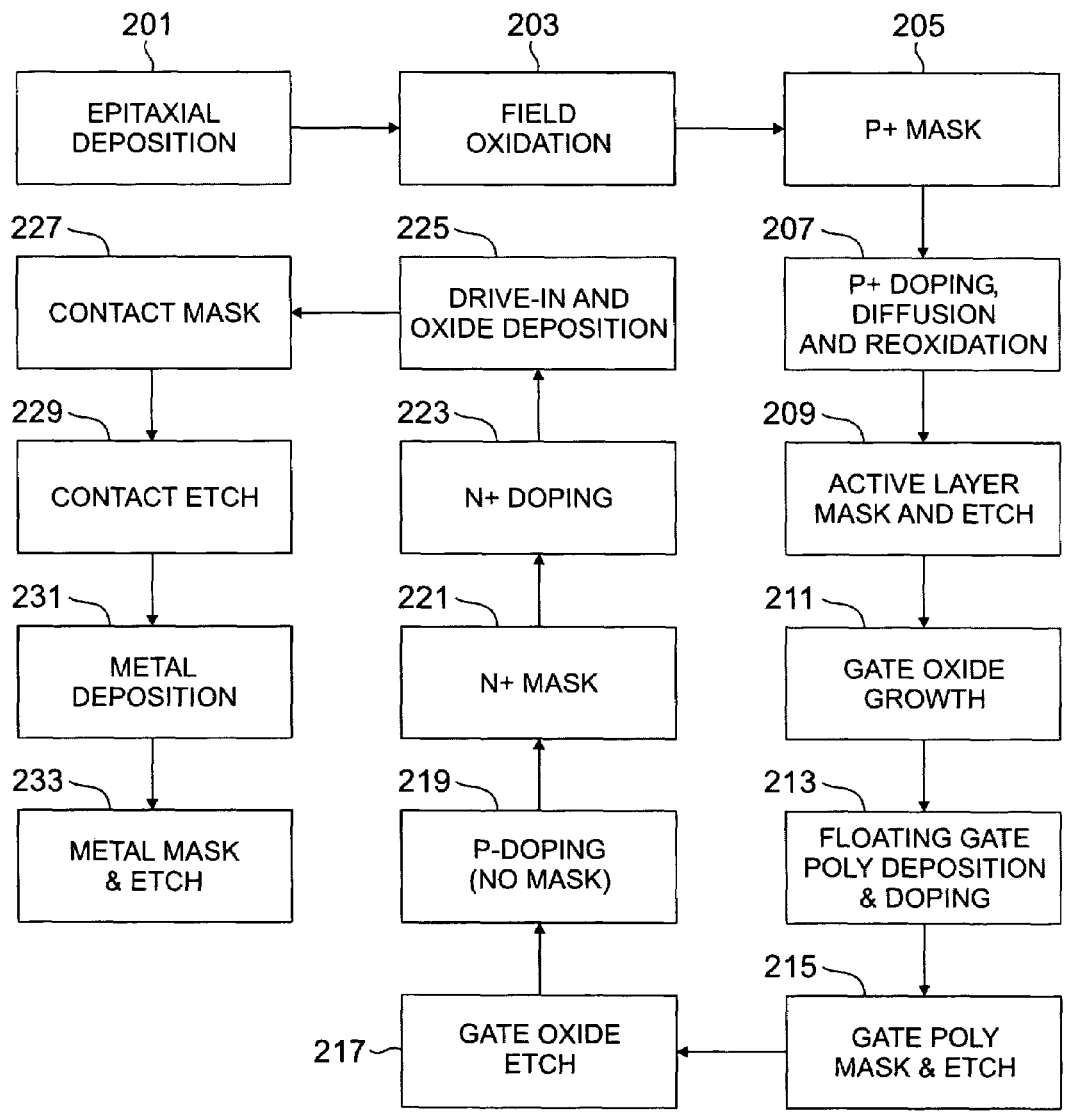
FIG. 10 is a flow chart illustrating a possible fabrication sequence that may be used to produce a DMOS device before the additional steps that make the threshold voltage programmable.

Returning again to FIG. 10, a layer of gate oxide is grown 211 in the active region of the substrate followed by poly deposition and doping 213. A poly mask is then utilized, followed by a poly etch 215 and then a gate oxide etch 217. The resulting structure is depicted in FIG. 9b, which includes the fully formed polysilicon region 307 and the gate oxide layer 309 in addition to the p+ diffused regions 310.

Returning again to FIG. 10, p− doping 219 occurs (without a mask). Then, an n+ mask is utilized 221, followed by n+ doping 223. After drive-in and oxide deposition 225, the structure depicted in FIG. 9c results, which now includes a diffused body 311 consisting of deep p+ diffused regions and shallower p− diffused regions as well as n+ source regions 312.

Returning again to FIG. 10, a contact masking layer is applied and defined 227, followed by a contact etch 229, metal deposition 231, and metal masking and etching 233. The structure depicted in FIG. 9d results, which now includes a metal layer 313 in electrical contact with the sources and bodies. A passivation layer is typically applied to the top surface, then masked and etched to allow access to the top metal, and the back surface is ground and a metal layer is deposited to form an ohmic contact to the wafer.

Figure 11:
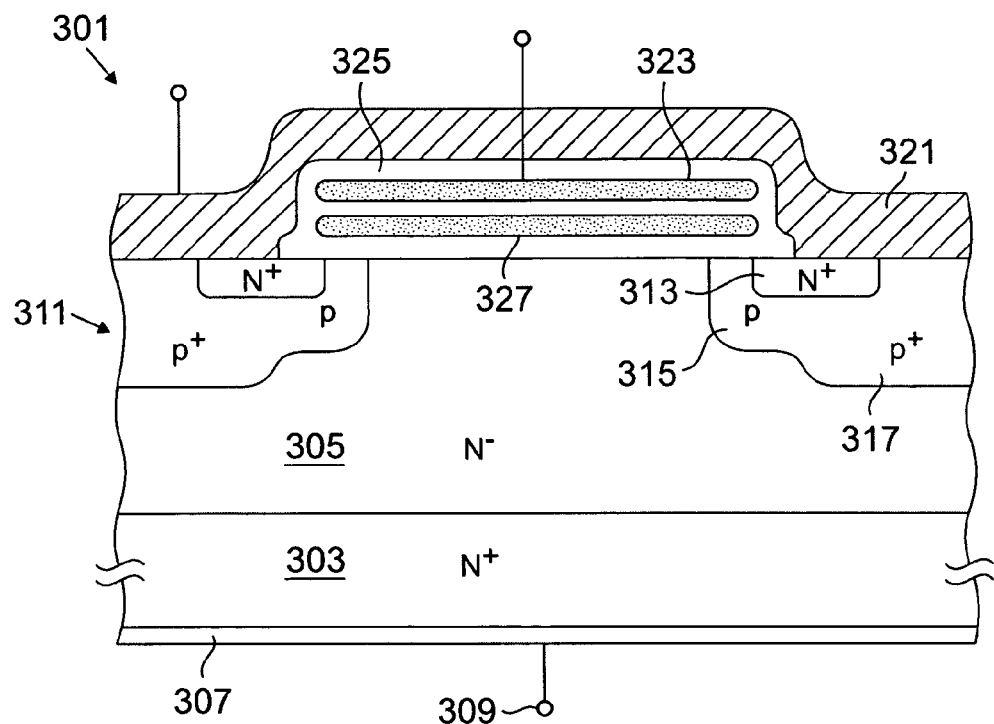
FIG. 11 is a cross-sectional view of an embodiment of a DMOS programmable current source in accordance with the present invention which has both a floating gate and a control gate.

FIG. 11 illustrates another configuration possible for DMOS devices made in accordance with the teachings herein which makes use of both a floating gate and a control gate. The device depicted therein is a vertical DMOS 301 which consists of an n+ substrate 303, on one surface of which is disposed an n− epitaxial layer 305 and on the other surface of which is disposed a metal layer 307 which serves as a drain electrode. The device is also provided with a drain lead 309. A source and body region 311 is implanted in the surface of the epitaxial layer, and consists of a diffused source region 313, a shallower diffused body region 315, and a deeper diffused body region 317. In the particular device illustrated, the shallower diffused body region is a p body region and the deeper diffused region is a p+ body region. The diffused body regions may be formed, for example, by ion implantation with boron or another appropriate material. The diffused source region may be formed, for example, by ion implantation with phosphorus, antimony or arsenic. A portion of the p body region extends underneath the body/source-gate electrode 321 and is capable of undergoing inversion to form a channel. The device has a polysilicon floating gate 327 which is disposed over the entire channel and drain region (the region of the floating gate used for programming is not shown). The floating gate is surrounded by gate dielectric material 325 such as silicon oxide or silicon nitride. A control gate 323 serves to bias the device, allowing more or less current to flow between the drain and the source as the bias voltage changes. The bias voltage is referenced to the source/body voltage.

Figure 12:
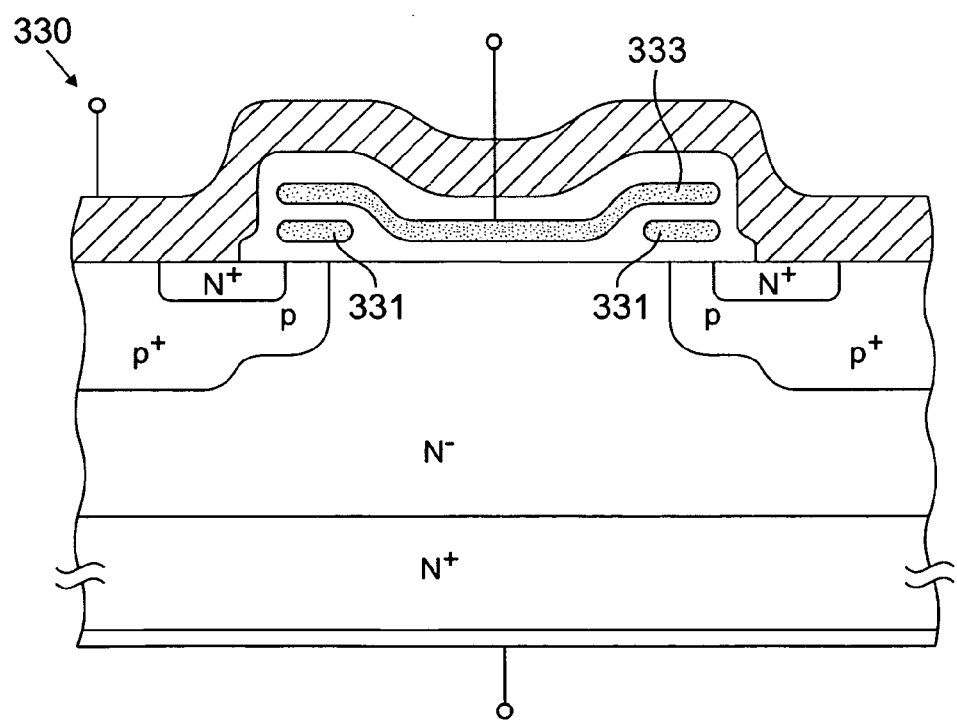
FIG. 12 is a cross-sectional view of an embodiment of a DMOS programmable current source in accordance with the present invention which has both a floating gate and a control gate, and in which the floating gate or gates are disposed only above the channel region.

FIG. 12 shows a further embodiment of a transistor 330 in accordance with the present invention. The transistor of FIG. 12 differs from that depicted in FIG. 11 in that the floating gate or gates 331 are disposed only above the channel region, and the control gate 333 accordingly has a different cross-section in this region of the device.

The fabrication sequence for a device of the type depicted in FIGS. 11 and 12 will typically be similar to the fabrication sequences used in the manufacture of conventional DMOS devices, and will typically include the deposition, doping, and photomasking of an additional layer of poly silicon for the programming electrode, in addition to an extra photomasking and oxidation step for the tunneling layer or region. These additional steps are described below:

1. Deposition of a layer of poly silicon for the floating gate, which in one version may be masked simultaneously with the top of "control" gate.
2. Programming region mask and etch.
3. Formation of a thin programming dielectric oxide layer on regions of the floating gate opened by the previous step. The thickness and other characteristics of this oxide layer are carefully controlled to allow the threshold voltage to be programmed. The other steps in the fabrication sequence are similar to those used in making conventional DMOS devices. The deposition, masking, and etching of a passivation layer is not shown in FIG. 9, but is normally performed before the manufacturing process is complete.

Figure 13A:
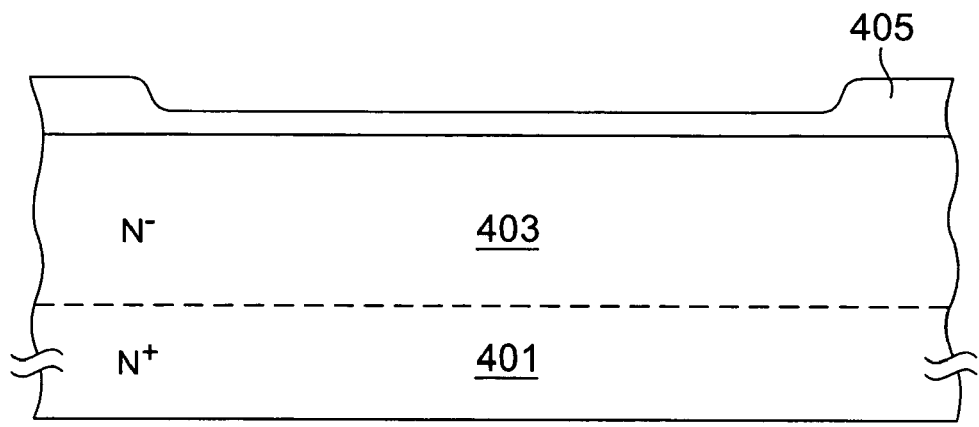
FIGS. 13a–13e are cross-sectional views illustrating one particular example of a possible sequence of steps that can be used to fabricate the floating gate and programming electrode of a transistor in accordance with the present invention.
Figure 15:
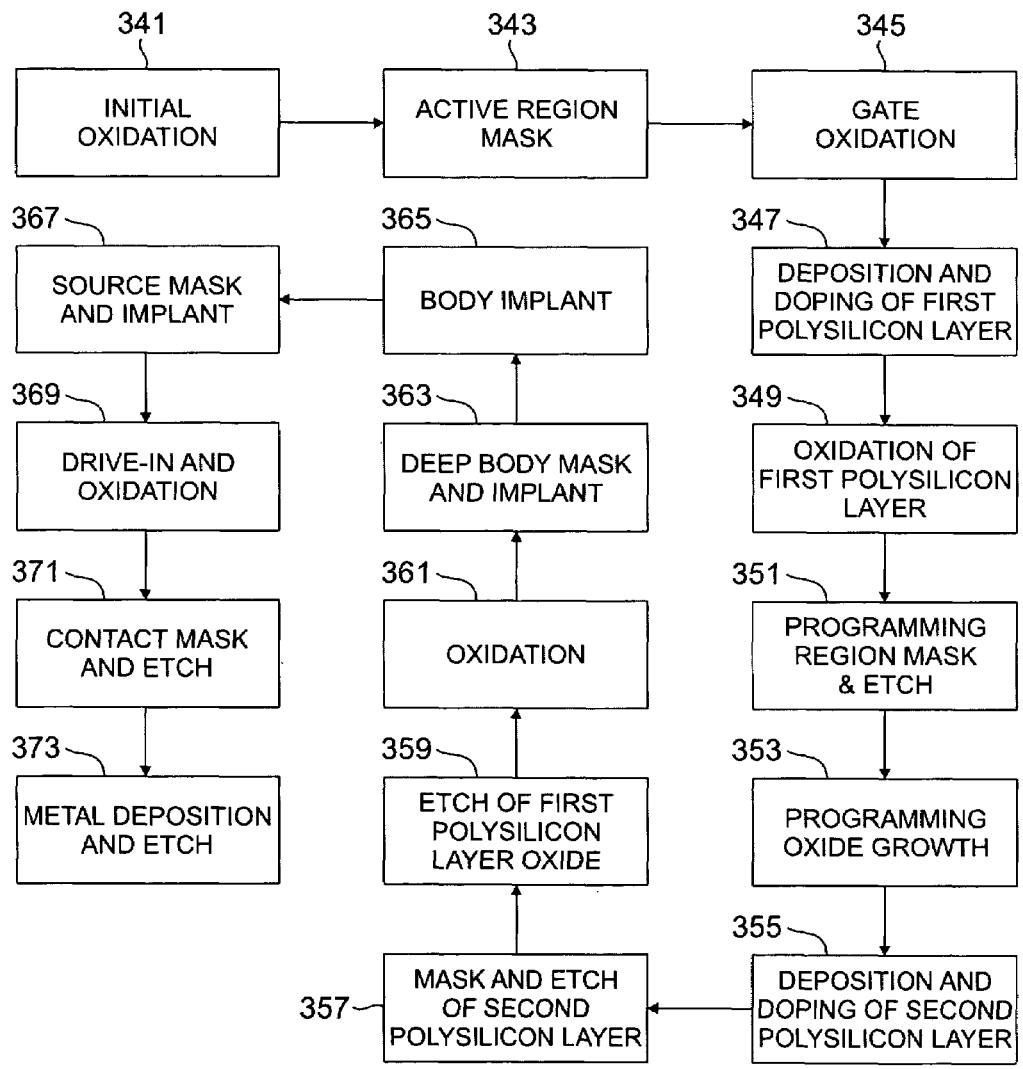
FIG. 15 is a flow chart illustrating a possible sequence of steps that could be used to fabricate a transistor in accordance with the present invention.

FIGS. 13a–13e illustrate one particular example of a possible sequence of steps that could be used to fabricate a transistor in accordance with the present invention with the steps needed to include the floating gate and the programming electrode. The process, which is depicted in the flow chart of FIG. 15, begins with an initial oxidation 341, an active region mask 343 and a gate oxidation 345. As depicted in FIG. 13a, the resulting structure consists of an $n^+$ wafer 401, an $n^-$ epitaxial layer 403 and a layer of silicon oxide 405.

Figure 13B:
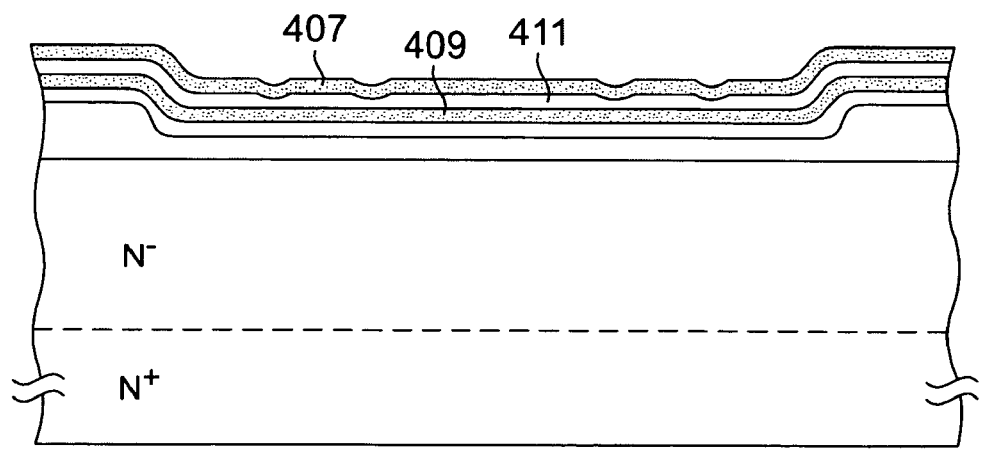
Figure 13C:
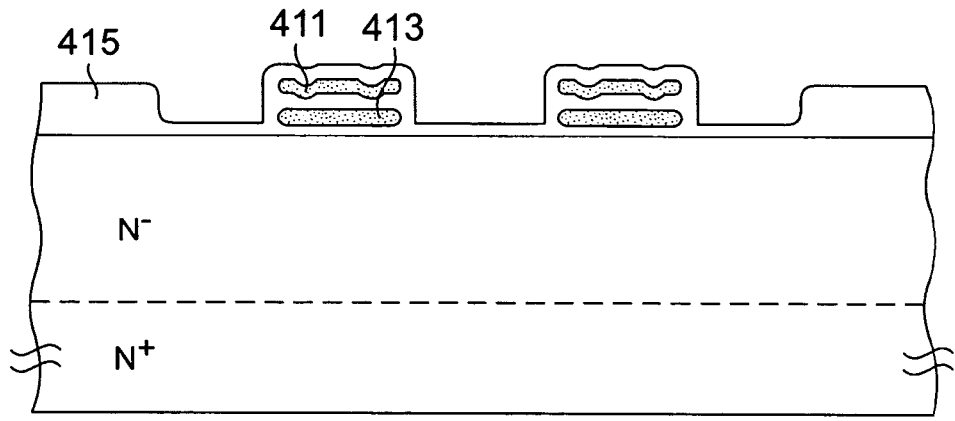

Returning again to FIG. 15, a first polysilicon layer is deposited and doped 347, followed by oxidation 349 of the first polysilicon layer. Next, the programming region is masked and etched 351, the programming oxide is grown 353, and a second layer of polysilicon is deposited and doped 355. As depicted in FIG. 13b, the resulting structure now includes a first 407 and second 409 layer of polysilicon, separated by an oxide layer 411.

Returning again to FIG. 15, the second layer of polysilicon is then masked and etched 357, the oxide layer between the first and second layers of polysilicon is etched 359, and the first layer of polysilicon is etched 361. The etched substrate is then subjected to an oxidation to result in the structure depicted in FIG. 13c, which now includes a polysilicon control gate 411 and floating gate 413 encapsulated in an oxide matrix 415.

Figure 13D:
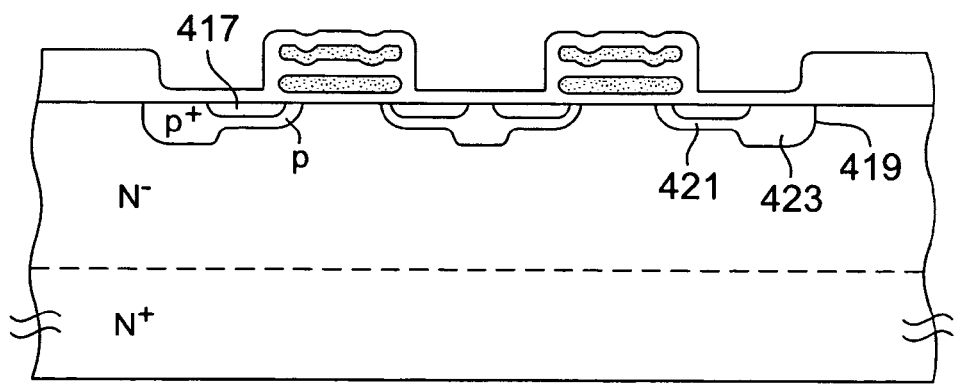
Figure 13E:
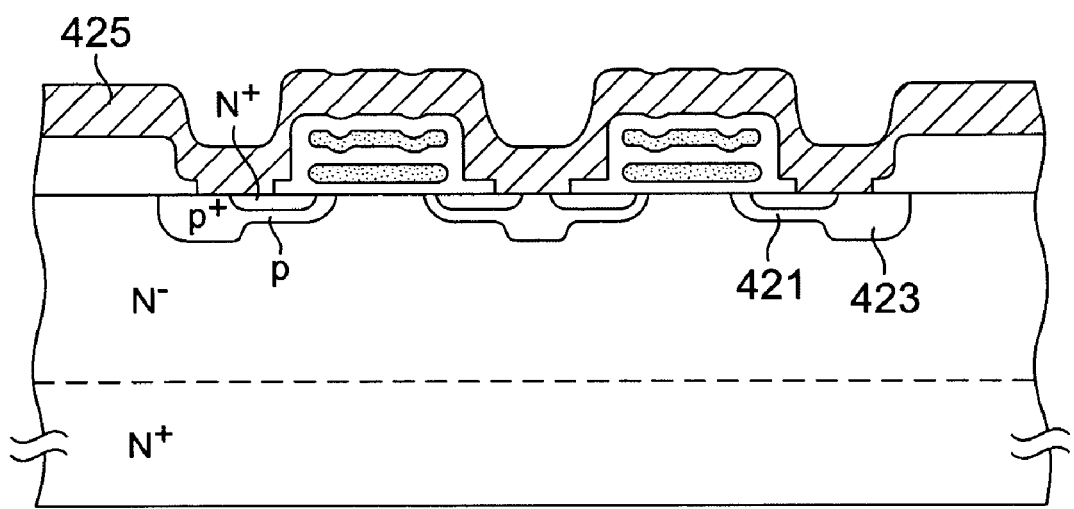

Returning again to FIG. 15, a deep body region is masked and implanted 363, followed by implantation of the body 365, source mask and implantation 367, and drive-in and oxidation 369. The resulting device, which is illustrated in FIG. 13d, now features an $n^+$ source 417 and a body region 419 consisting of a shallow diffused region 421 and a deeper diffused region 423. In the device illustrated, the shallow diffused region is a p body region and the deeper diffused region is a $p^+$ body region.

Returning again to FIG. 15, the device is completed with a contact mask and etch 371 and a metal deposition and etch 373. The resulting structure, shown in FIG. 13e, now contains a source metallization layer 425.

Figure 14A:
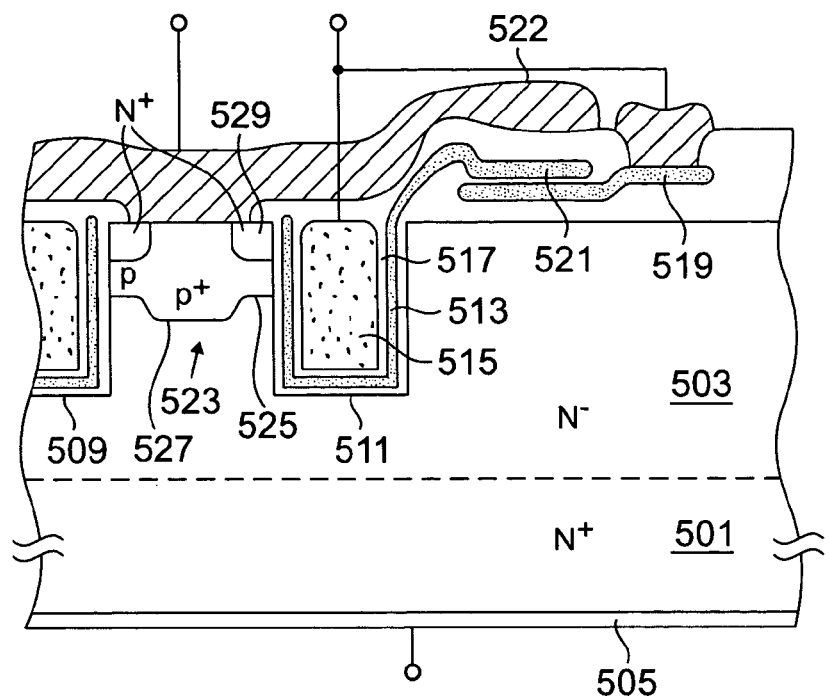
FIG. 14a is a cross-sectional view of an embodiment of a trench DMOS programmable current source in accordance with the present invention which has two poly layers and a tunnel oxide layer disposed between the two poly layers.
Figure 14B:
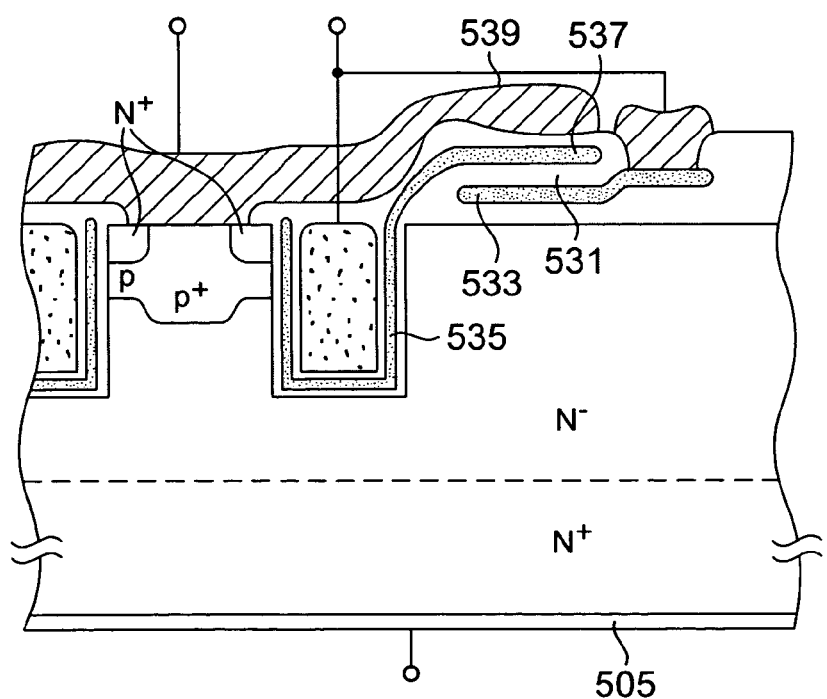
FIG. 14b is a cross-sectional view of an embodiment of a trench DMOS programmable current source in accordance with the present invention which has two poly layers and a tunnel oxide layer disposed between the upper poly layer and the source/body metallization layer.

FIGS. 14a–b illustrate how the principles set forth herein can be applied to trench DMOS devices. With reference to FIG. 14a, the device depicted therein is a vertical DMOS structure which consists of an $n^+$ substrate 501, on one surface of which is disposed an epitaxial layer 503 and on the other surface of which is disposed a metal layer 505 which serves as a drain electrode. The epitaxial layer includes first 509 and second 511 trenches. Each trench includes a floating gate 513 and a polysilicon electrode 515 which are separated from each other by a dielectric material 517. A polysilicon electrode 515 is in electrical contact with bottom programming electrode 519, the later of which also serves as the tunneling electrode and is separated from the floating gate by a portion of tunneling dielectric 521. The body/source and gate metal 522 serves as the top programming electrode in this embodiment.

A body 523 is implanted in the surface of the epitaxial layer between the trenches, and consists of a shallower diffused region 525 and a deeper diffused region 527. In the device illustrated, the shallower diffused region is a p body region and the deeper diffused region is a $p^+$ body region. The deeper diffused region and the shallower diffused region may be formed by ion implantation with boron. A diffused source region 529 is also provided which may be formed by ion implantation with phosphorus, antimony or arsenic.

FIG. 14b illustrates another trench device which is similar in most respects to the device of FIG. 14a, except that the dielectric layer 531 between the bottom programming electrode 533 and the floating gate 535 is thicker (e.g., about 2 to about 10 times) than the dielectric layer 537 disposed between the floating gate and the body/source and gate metal 539 which also serves as the top programming electrode. In this embodiment, the dielectric layer 537 disposed between the floating gate and the body/source and gate metal is sufficiently thin (typically in the range of about 80 to about 250 Å) to allow tunneling between top programming electrode metal and the floating gate to occur for the purposes of programming the threshold voltage (that is, the body/source and gate metal serves as the tunneling electrode). Hence, in this embodiment, the dielectric layer 537 serves as the tunneling dielectric layer, and the bottom programming electrode 533 serves as the reference electrode.

There are a number of possible structures that produce a DMOS transistor with a programmable threshold voltage. TABLE 2 lists the structures that use at least two layers of polysilicon.

TABLE 2

Structures for Programmable MOS-Gated Devices That Use Two Or More Polysilicon Layers

| Top Programming Electrode | Bottom Programming Electrode | Location of Tunnel Dielectric | Number of Polysilicon Layers | FIG. |
|---|---|---|---|---|
| source/body metal | dedicated poly | bottom of floating gate | 3 | 16a |
| source/body metal | dedicated poly | top of floating gate | 3 | 16b |
| control gate | dedicated poly | bottom of floating gate | 3 | 16c |
| control gate | dedicated poly | top of floating gate | 3 | 16d |

TABLE 2-continued

Structures for Programmable MOS-Gated Devices That Use Two Or More Polysilicon Layers

| Top Programming Electrode | Bottom Programming Electrode | Location of Tunnel Dielectric | Number of Polysilicon Layers | FIG. |
|---|---|---|---|---|
| dedicated poly | common diffused region | bottom of floating gate | 3 | 16e |
| dedicated poly | common diffused region | top of floating gate | 3 | 16f |
| source/body metal | dedicated diffused region | bottom of floating gate | 2 | 16g |
| source/body metal | dedicated diffused region | top of floating gate | 2 | 16h |
| dedicated poly | dedicated diffused region | bottom of floating gate | 3 | 16i |
| dedicated poly | dedicated diffused region | top of floating gate | 3 | 16j |
| control gate | dedicated diffused region | bottom of floating gate | 2 | 16k |
| control gate | dedicated diffused region | top of floating gate | 2 | 16l |
| control gate | common diffused region | bottom of floating gate | 2 | 16m |
| control gate | common diffused region | top of floating gate | 2 | 16n |

These structures will work for both planar and trench MOS-gated devices. Their implementation is shown in FIGS. 16a–16l. For ease of illustration, only the programming portion of the device is shown for each implementation.

Figure 16A:
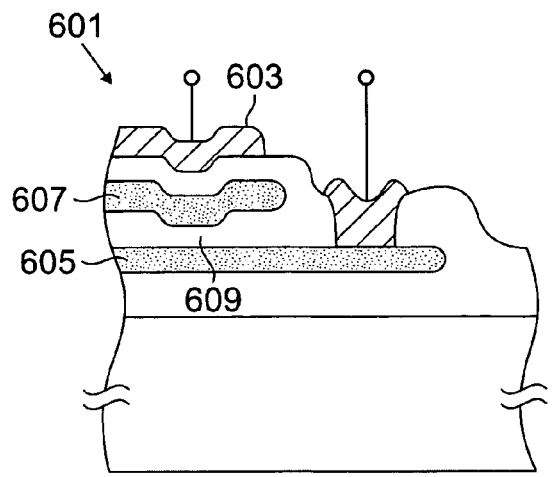
FIGS. 16a–16n are cross-sectional views of various DMOS transistors with programmable threshold voltages that utilize multiple layers of polysilicon and that employ layers of polysilicon for the floating gate and control gate.
Figure 16B:
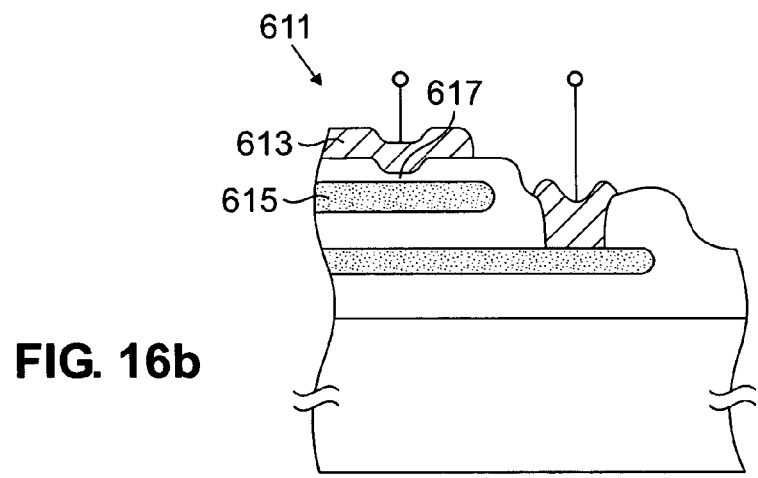

With reference to FIG. 16a, the programmable MOS-gated device 601 depicted therein utilizes a source/body metallization 603 as the top programming electrode and a dedicated polysilicon electrode 605 as the bottom programming electrode. The charge on the floating gate 607 is adjusted by applying a voltage across the top and bottom programming electrodes, which results in the tunneling of charge carriers through the dielectric material 609 disposed between the bottom programming electrode and the floating gate. The device 611 depicted in FIG. 16b utilizes a set-up which is similar to that of FIG. 16a, except that tunneling in the later device is made to occur through the dielectric material 617 disposed between the top programming electrode 613 and the floating gate 615.

Figure 16C:
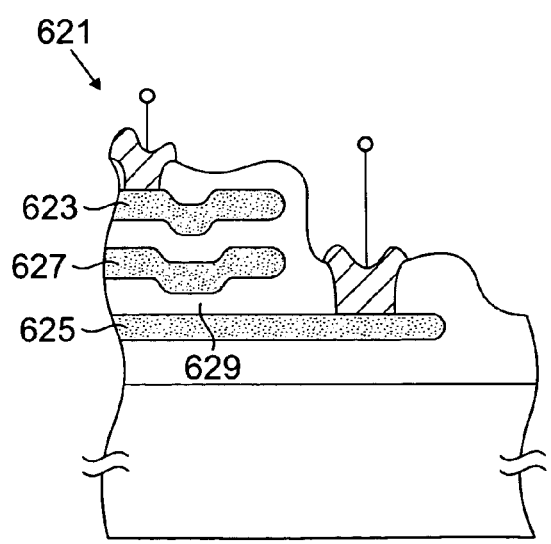
Figure 16D:
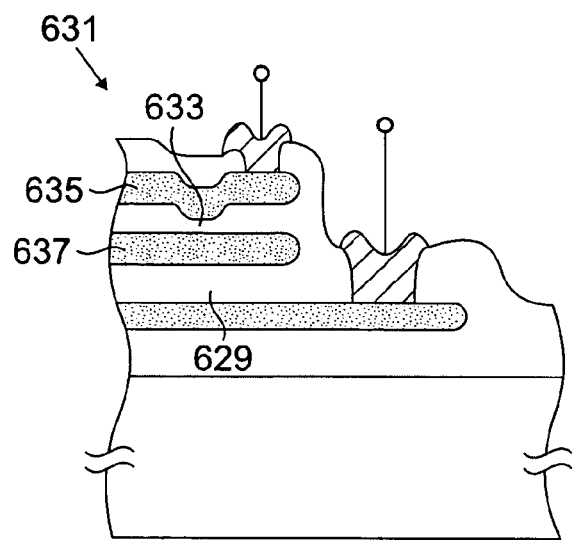

With reference to FIG. 16c, the programmable MOS-gated device 621 depicted therein utilizes a control gate 623 as the top programming electrode and a dedicated polysilicon electrode 625 as the bottom programming electrode. The charge on the floating gate 627 is adjusted by applying a voltage across the top and bottom programming electrodes, which results in the tunneling of charge carriers through the dielectric material 629 disposed between the bottom programming electrode and the floating gate. The device 631 depicted in FIG. 16d utilizes a set-up which is similar to that of FIG. 16c, except that tunneling in the later device is made to occur through the dielectric material 633 disposed between the top programming electrode 635 and the floating gate 637.

Figure 16E:
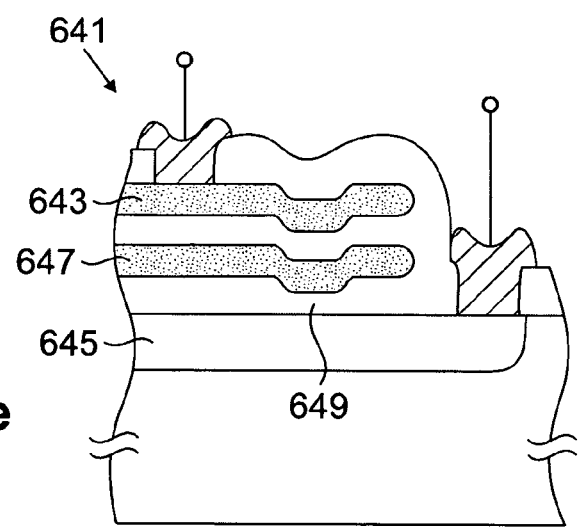
Figure 16F:
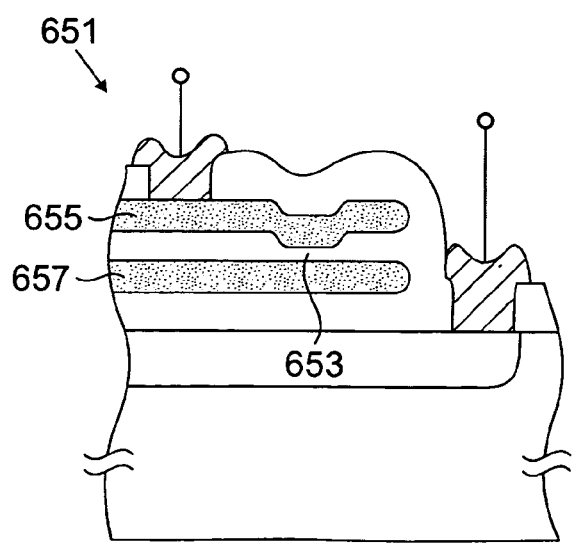

With reference to FIG. 16e, the programmable MOS-gated device 641 depicted therein utilizes a dedicated polysilicon electrode 643 as the top programming electrode and a common diffused region 645 as the bottom programming electrode. The charge on the floating gate 647 is adjusted by applying a voltage across the top and bottom programming electrodes, which results in the tunneling of charge carriers through the dielectric material 649 disposed between the bottom programming electrode and the floating gate. The device 651 depicted in FIG. 16d utilizes a set-up which is similar to that of FIG. 16f, except that tunneling in the later device is made to occur through the dielectric material 653 disposed between the top programming electrode 655 and the floating gate 657.

Figure 16G:
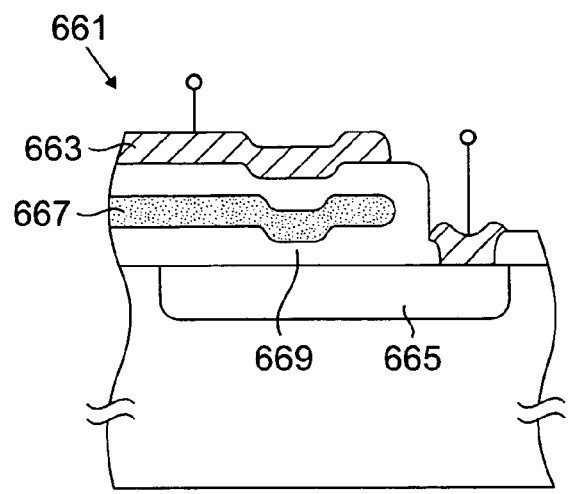
Figure 16H:
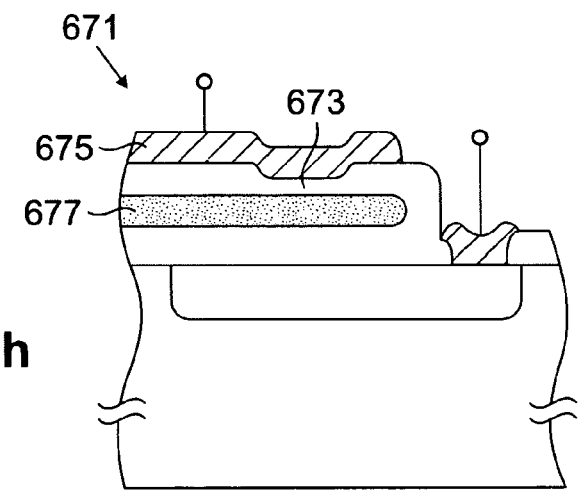

With reference to FIG. 16g, the programmable MOS-gated device 661 depicted therein utilizes source/body metallization 663 as the top programming electrode and a dedicated diffused region 665 as the bottom programming electrode. The charge on the floating gate 667 is adjusted by applying a voltage across the top and bottom programming electrodes, which results in the tunneling of charge carriers through the dielectric material 669 disposed between the bottom programming electrode and the floating gate. The device 671 depicted in FIG. 16h utilizes a set-up which is similar to that of FIG. 16g, except that tunneling in the later device is made to occur through the dielectric material 673 disposed between the top programming electrode 675 and the floating gate 677.

Figure 16I:
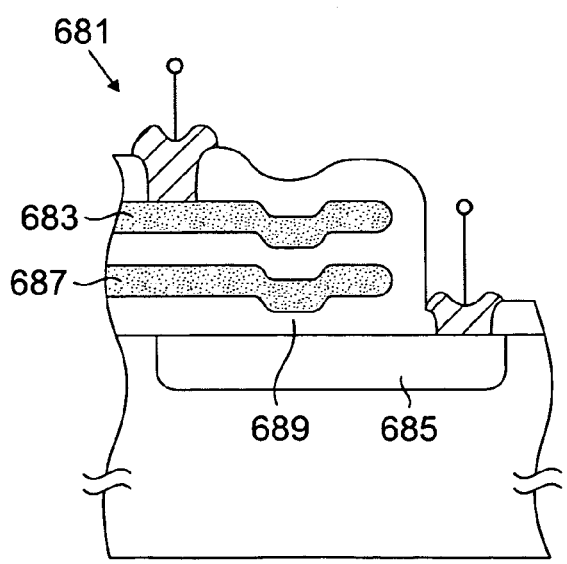
Figure 16J:
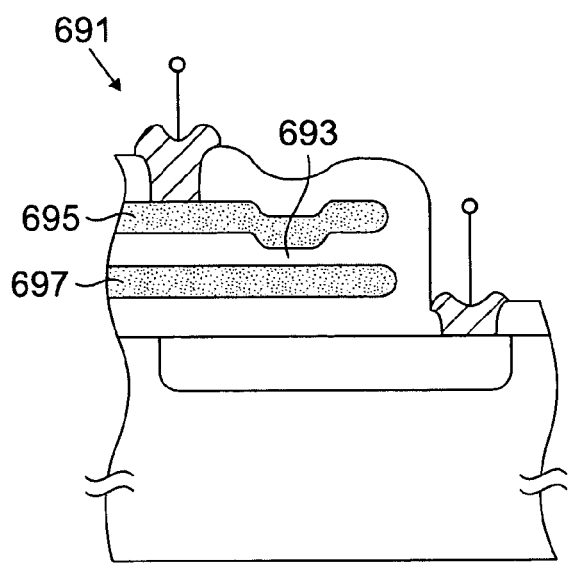

With reference to FIG. 16i, the programmable MOS-gated device 681 depicted therein utilizes a dedicated polysilicon electrode 683 as the top programming electrode and a dedicated diffused region 685 as the bottom programming electrode. The charge on the floating gate 687 is adjusted by applying a voltage across the top and bottom programming electrodes, which results in the tunneling of charge carriers through the dielectric material 689 disposed between the bottom programming electrode and the floating gate. The device 691 depicted in FIG. 16j utilizes a set-up which is similar to that of FIG. 16i, except that tunneling in the later device is made to occur through the dielectric material 693 disposed between the top programming electrode 695 and the floating gate 697.

Figure 16K:
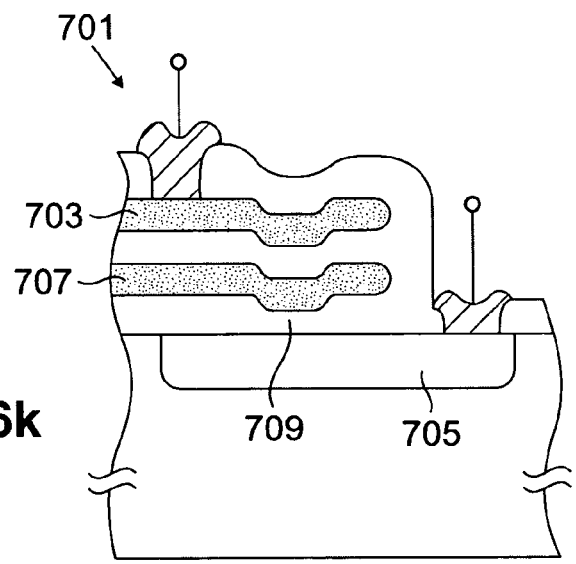
Figure 16L:
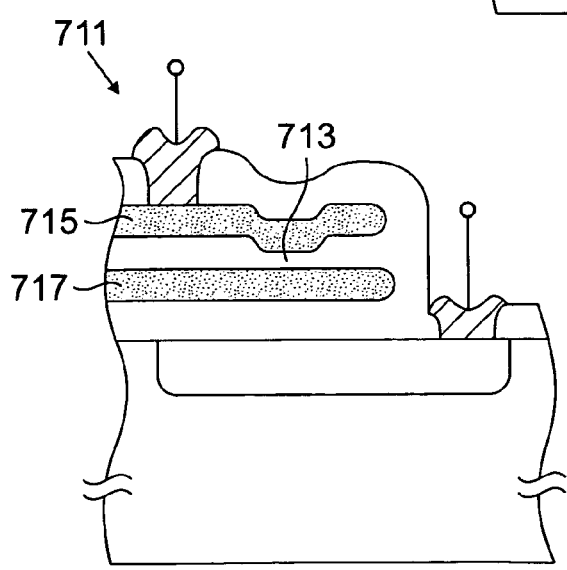

With reference to FIG. 16k, the programmable MOS-gated device 701 depicted therein utilizes a control gate 703 as the top programming electrode and a dedicated diffused region 705 as the bottom programming electrode. The charge on the floating gate 707 is adjusted by applying a voltage across the top and bottom programming electrodes, which results in the tunneling of charge carriers through the dielectric material 709 disposed between the bottom programming electrode and the floating gate. The device 711 depicted in FIG. 16l utilizes a set-up which is similar to that of FIG. 16k, except that tunneling in the later device is made to occur through the dielectric material 713 disposed between the top programming electrode 715 and the floating gate 717.

Figure 16M:
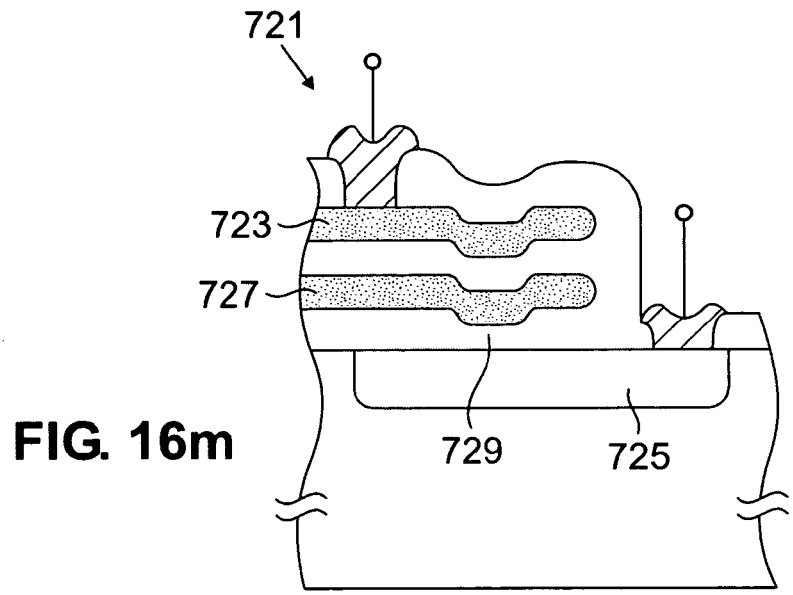
Figure 16N:
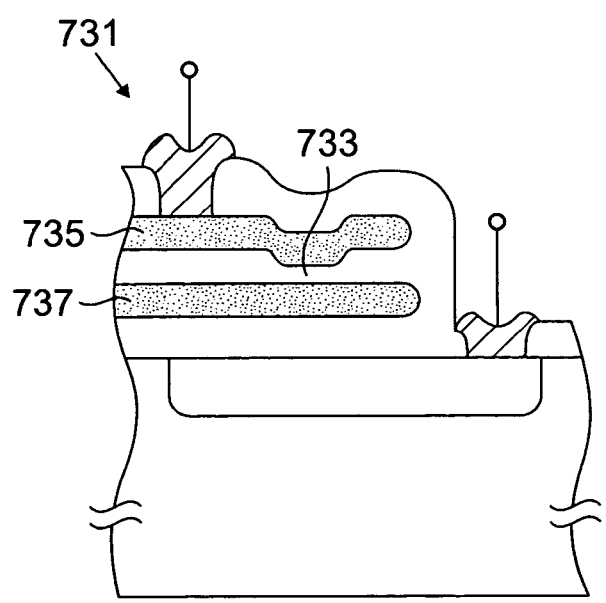

With reference to FIG. 16m, the programmable MOS-gated device 701 depicted therein utilizes a control gate 723 as the top programming electrode and a dedicated diffused region 725 as the bottom programming electrode. The charge on the floating gate 727 is adjusted by applying a voltage across the top and bottom programming electrodes, which results in the tunneling of charge carriers through the dielectric material 729 disposed between the bottom programming electrode and the floating gate. The device 711 depicted in FIG. 16n utilizes a set-up which is similar to that of FIG. 16m, except that tunneling in the later device is made to occur through the dielectric material 733 disposed between the top programming electrode 735 and the floating gate 737.

The diffused regions that are used for the bottom programming electrode, whether dedicated (i.e., separate from other diffusions that form the MOS-gated device) or common (i.e., continuous with the diffusions that form the MOS-gated device) may be doped just p-type as shown in FIGS. 6a and 6b, or may be doped n-type, and may be located in a deeper p-type diffused region as shown in FIG. 8a through 8d.

While some specific possible fabrication flows have been described herein for the manufacture of both two terminal current source devices and three terminal enhancement or depletion mode transistors in accordance with the present invention, it is to be understood that many variations in these methodologies are possible without departing from the scope of the present invention. For example, the sequence of steps used in the fabrication of devices made in accordance with the present invention may include LOCOS in one or more steps. In addition, the deep body (or deep p$^+$) region, the body region, and the source region may be diffused sequentially or simultaneously. Also, in the various transistors and other devices made in accordance with the present invention, the p$^+$ region may be shallower than the body region, there may be multiple body regions, or there may be one or more p-type diffusions in the body region.

Moreover, while the figures depict n-channel MOSFETS, n-channel IGBTs, n-channel MCTs and other n-channel MOS-gated devices may also be fabricated that allow a precise amount of current to flow with no voltage applied to the gate. In addition, by changing n-type regions to p-type regions and reversing the polarity of the applied voltages, p-channel MOSFETs, IGBTs, MCTs, and other p-channel MOS-gated devices having corresponding characteristics may also be fabricated.

It will thus be appreciated that various additions, substitutions and modifications may be made to the above described embodiments without departing from the scope of the present invention. Accordingly, the scope of the present invention should be construed solely in reference to the appended claims.

What is claimed is:

1. A DMOS transistor with an adjustable threshold voltage, comprising:
   a trench;
   first and second programming electrodes;
   a floating gate having a first portion disposed in said trench over the entire trench and a second portion disposed between said first and second programming electrodes outside the trench; and
   a dielectric material disposed between said floating gate and said first programming electrode;
     wherein the threshold voltage of the MOS-gated device is adjustable by applying a sufficient voltage across said first and second programming electrodes.

2. The DMOS transistor of claim 1, further comprising a polysilicon electrode disposed in said trench.

3. The DMOS transistor of claim 2, wherein said polysilicon electrode and said second portion of said floating gate are separated from each other by a dielectric material.

4. The DMOS transistor of claim 1, wherein said first and second programming electrodes are adapted to adjust the charge on the floating gate.

5. The DMOS transistor of claim 1, wherein at least one of the first and second programming electrodes is a polysilicon electrode.

6. The DMOS transistor of claim 1, wherein at least one of the first and second programming electrodes is a body region.

7. The DMOS transistor of claim 1, wherein the transistor comprises a channel region, and further comprising a dielectric material disposed between the channel region and the floating gate, and wherein the current output of the current source is adjustable by causing charge carriers to tunnel through the dielectric material.

8. The DMOS transistor of claim 1, further comprising a programming electrode disposed adjacent to the floating gate, and a dielectric material disposed between the programming electrode and the floating gate, and wherein the current output of the current source is adjustable by causing charge carriers to tunnel through the dielectric material.

9. The DMOS transistor of claim 1, wherein the floating gate comprises polysilicon.

10. The DMOS transistor of claim 1, wherein the floating gate is encapsulated in a dielectric material.

11. The DMOS transistor of claim 1, wherein the dielectric material has a thickness of less than about 250 Å.

12. The DMOS transistor of claim 1, wherein the dielectric material has a thickness within the range of about 50 Å to about 250 Å.

13. The DMOS transistor of claim 1, wherein the DMOS transistor has a threshold voltage with a magnitude of at least 1 volt.

14. The DMOS transistor of claim 1, wherein the DMOS transistor has a threshold voltage with a magnitude within the range of about 1 to about 10 volts.

15. A DMOS transistor with an adjustable threshold voltage, comprising:
   a trench;
   first and second programming electrodes;
   a floating gate having a first portion disposed in said trench and a second portion disposed between said first and second programming electrodes; and
   a dielectric material disposed between said floating gate and said first programming electrode;
     wherein the threshold voltage of the MOS-gated device is adjustable by applying a sufficient voltage across said first and second programming electrodes, and,
     wherein the transistor comprises a metallization layer, and wherein at least one of the first and second programming electrodes is the metallization layer.

* * * * *